(12) United States Patent
Lee

(10) Patent No.: US 8,389,364 B2
(45) Date of Patent: Mar. 5, 2013

(54) METHOD OF FABRICATING A TRANSISTOR

(75) Inventor: Sang Don Lee, Guri-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 73 days.

(21) Appl. No.: 13/196,606

(22) Filed: Aug. 2, 2011

(65) Prior Publication Data

US 2011/0287599 A1    Nov. 24, 2011

Related U.S. Application Data

(62) Division of application No. 12/265,902, filed on Nov. 6, 2008, now Pat. No. 8,012,834.

(30) Foreign Application Priority Data

May 30, 2008   (KR) .................. 10-2008-0050941

(51) Int. Cl.
*H01L 21/336* (2006.01)
(52) U.S. Cl. ................ 438/270; 438/424; 257/E21.384; 257/E21.546
(58) Field of Classification Search ........... 257/E21.384, 257/E21.429, E21.546; 438/270, 424
See application file for complete search history.

(56) References Cited

U.S. PATENT DOCUMENTS

| 7,588,985 | B2 | 9/2009 | Kim | |
|---|---|---|---|---|
| 7,846,844 | B2* | 12/2010 | Kim | ............................ 438/703 |
| 2010/0163976 | A1 | 7/2010 | Lee et al. | |
| 2010/0219467 | A1 | 9/2010 | Kim | |

FOREIGN PATENT DOCUMENTS

| KR | 10-2007-0001456 | 1/2007 |
|---|---|---|
| KR | 10-2007-0070924 | 7/2007 |
| KR | 10-2007-0070932 | 7/2007 |
| KR | 10-0806610 | 2/2008 |

OTHER PUBLICATIONS

Chung et al., "Highly Scalable Saddle-Fin (S-Fin) Transistor for Sub-50nm DRAM Technology," Symposium on VLSI Technology Digest of Technical Papers, IEEE, 2006. 2 pages.

* cited by examiner

*Primary Examiner* — Minh-Loan T Tran
(74) *Attorney, Agent, or Firm* — Marshall, Gerstein & Borun LLP

(57) ABSTRACT

A method of fabricating a saddle-fin transistor may include: forming a buffer oxide film and a hard mask oxide film over a semiconductor substrate; etching the buffer oxide film, the hard mask oxide film and the semiconductor substrate corresponding to a mask pattern to form a trench corresponding to a gate electrode and a fin region; oxidizing the exposed semiconductor substrate in the trench to form a gate oxide film; depositing a gate lower electrode in the trench; and depositing a gate upper electrode over the gate lower electrode to fill the trench.

13 Claims, 22 Drawing Sheets

$W'' \gg W'$

METHOD OF FABRICATING A TRANSISTOR

CROSS-REFERENCES TO RELATED APPLICATIONS

This is a division of U.S. application Ser. No. 12/265,902 filed Nov. 6, 2008, which claims the priority benefit under USC 119 of KR 10-2008-0050941 filed May 30, 2008, the entire respective disclosures of which are incorporated herein by reference.

BACKGROUND OF THE INVENTION

The present invention generally relates to a method of fabricating a semiconductor apparatus, and more specifically, to a method of fabricating a semiconductor apparatus including plural saddle-fin transistors to reduce operating defects due to mis-alignment.

Generally, a semiconductor is a material that belongs to a middle region between a conductor and a nonconductor depending on electric conductivity. Although the semiconductor is similar to the nonconductor in a pure state, the electric conductivity of the semiconductor is enhanced by addition of impurities or other manipulation. With added impurities and connected to the conductor, the semiconductor is useful for manufacturing semiconductor devices. A semiconductor apparatus refers to apparatus that has various functions obtained by using the semiconductor device. A representative example of the semiconductor device is a semiconductor memory apparatus.

The semiconductor memory apparatus includes a plurality of unit cells each having a capacitor and a transistor. A capacitor is used to store data temporarily, and a transistor is used to transmit data between a bit line and the capacitor in response to a control signal (word line) by using a semiconductor property, that is the electric conductivity changing depending on environment. The transistor includes a gate, a source and a drain, and charges move between the source and the drain in response to the control signal inputted into the gate. The movement of charges between the source and the drain is performed through a channel region by using the semiconductor property.

When a general transistor is formed in a semiconductor substrate, a gate is formed in the semiconductor substrate, and impurities are doped in both sides of the gate to form a source and a drain. Due to an increase in the data capacity and integration of the semiconductor memory apparatus, the size of each unit cell is required to be smaller. That is, the design rule of the capacitor and the transistor in the unit cell is decreased. Likewise, the channel length of the cell transistor is reduced leading to the so-called short channel effect and a drain induced barrier lower (DIBL) effect in the transistor, thereby degrading the reliability of the operation. The short channel effect and the DIBL effect can be prevented when a threshold voltage is maintained so that the cell transistor may perform a normal operation. Generally, as the channel of the transistor becomes shorter, the doping concentration of impurities in the channel-forming-region is increased.

However, as the design rule is reduced to less than 100 nm, the increase of the doping concentration in the channel region increases an electric field of the storage node (SN) junction, degrading a refresh characteristic of the semiconductor memory apparatus. For prevention of the degradation, although the design rule is decreased, a cell transistor having a three-dimensional channel structure where the channel is vertically extended has been used so as to maintain the channel length of the cell transistor. That is, although the horizontal channel width is short, the doping concentration can be decreased corresponding to the vertical channel length to prevent the degradation.

BRIEF SUMMARY OF THE INVENTION

Various embodiments of the present invention are directed at providing a method of fabricating a semiconductor memory apparatus to reduce mis-alignment in forming a gate of a three-dimensional cell transistor included in the semiconductor apparatus and to improve the mis-alignment between gate patterns of the transistor disposed between a core region and a peripheral region.

According to an embodiment of the present invention, a method of fabricating a saddle-fin transistor may include: forming a buffer oxide film and a hard mask oxide film over a semiconductor substrate; etching the buffer oxide film, the hard mask oxide film and the semiconductor substrate corresponding to a mask pattern to form a trench corresponding to a gate electrode and a fin region; oxidizing the exposed semiconductor substrate in the trench to form a gate oxide film; depositing a gate lower electrode in the trench; and depositing a gate upper electrode over the gate lower electrode to fill the trench.

Preferably, the forming a hard mask oxide film may include performing a Shallow Trench Isolation (STI) process to form a device isolation film over the semiconductor substrate.

Preferably, the forming a trench may include: forming a self-aligned mask through a photolithography process by using the mask pattern; and etching the entire surface of the resulting structure by using the self-aligned mask.

Preferably, the forming a self-aligned mask may include: forming a hard mask polysilicon film over the hard mask oxide film; depositing a hard mask oxide film and a hard mask polysilicon film over the hard mask polysilicon film; depositing an antireflection film over the hard mask polysilicon film; depositing an upper hard mask polysilicon film over the anti-reflection film; etching the upper hard mask polysilicon film exposed by the mask pattern through the photolithography process; etching the anti-reflection film exposed by the etching process of the upper hard mask polysilicon film; and etching the exposed portion of the hard mask polysilicon film disposed at the bottom of the anti-reflection film.

Preferably, the forming a trench may include repeatedly performing a blanket-etching process from the mask pattern, which is the top layer of the self-aligned mask, along with the self-aligned mask and the exposed layer between the self-aligned masks by a different etching ratio until the semiconductor substrate is etched to form the fin region.

Preferably, the method further may include: forming a gate pattern having a gate electrode that may include the gate upper electrode and the gate lower electrode; and ion implanting impurities into both sides of the gate pattern to form source/drain regions.

Preferably, the forming a gate pattern may include: etching the gate upper electrode and the gate lower electrode; performing a wet-etching process on a space obtained from the etching process to remove a portion of the hard mask oxide film; depositing a nitride film in a space obtained from the etching process and the wet-etching process; and etching the hard mask oxide film with the nitride film as a mask to expose the buffer oxide film.

According to an embodiment of the present invention, a method of fabricating a semiconductor memory apparatus may include: performing a photolithography process by using a gate mask to form a self-aligned mask that determines location of plural transistors each having a saddle-fin transistor over a semiconductor substrate; repeatedly performing an etching process with a different etching ratio corresponding to the self-aligned mask in one region selectively exposed by an open mask from a first pattern region of the saddle fin transistor and a second pattern region of all transistors except the saddle fin transistor to form a trench; and forming a gate structure of the plural transistors in the trench.

Preferably, the saddle fin transistor is a cell transistor included in each unit cell.

Preferably, the forming a self aligned mask may include: performing a STI process to form a buffer oxide film and a device isolation film over the semiconductor substrate; forming a hard mask oxide film over the buffer oxide film and the device isolation film; depositing a sacrificial mask layer comprising plural hard mask oxide films, a hard mask polysilicon film, an antireflection film over the hard mask oxide film; and performing a self-aligned etching process on the sacrificial mask layer.

Preferably, the depositing a sacrificial mask layer may include: depositing a hard mask polysilicon film over the hard mask oxide film; depositing a hard mask oxide film and a hard mask polysilicon film over the hard mask polysilicon film; depositing an antireflection film over the hard mask polysilicon film; and depositing an upper hard mask polysilicon film over the antireflection film.

Preferably, the self-aligned etching process may include: etching the upper hard mask polysilicon film exposed by the photolithography process by using the gate mask; etching the antireflection film exposed by the etching process of the upper hard mask polysilicon film; and etching the exposed portion of the hard mask polysilicon film disposed in the bottom of the antireflection film.

Preferably, the forming a trench may include: exposing the first pattern region through an open mask after forming a photoresist film; repeatedly performing the blanket etching process to etch the exposed semiconductor substrate; forming a photoresist film over the resulting structure to expose the second pattern region; and repeatedly performing the blanket etching process to etch the exposed semiconductor substrate.

Preferably, the forming a gate structure may include: oxidizing the exposed semiconductor substrate in the trench to form a gate oxide film; depositing a lower electrode over the trench; depositing an upper electrode over the lower electrode to fill the trench; forming a gate hard mask nitride film over the lower electrode and the upper electrode; and removing the hard mask oxide film between the gate regions with the gate hard mask nitride film as a mask.

Preferably, the filling the trench may include filling a nitride film in an unfilled space when the trench is not completely filled due to the broad gate region of the transistor.

Preferably, the forming a gate structure further may include: performing a chemical mechanical polishing (CMP) process to expose the hard mask oxide film after filling the trench with the lower electrode, the upper electrode and the nitride film; and etching the top portion of the upper electrode and the lower electrode before forming a gate hard mask nitride film to wet-etch a portion of the top portion of the hard mask oxide film.

Preferably, the method further may include ion-implanting impurities in both sides of the gate structure to form source/drain regions.

According to an embodiment of the present invention, a semiconductor memory apparatus having a saddle-fin transistor may include: a fin region formed to have a depth larger than a critical dimension in a semiconductor substrate; a gate insulating film formed between the fin region and the semiconductor substrate; a gate pattern surrounded with a nitride film and a hard mask oxide film for protecting a gate electrode that may include a lower electrode and an upper electrode; and source/drain regions ion-implanted with impurities into both sides of the gate pattern. The bottom of the gate pattern is surrounded with the hard mask oxide film.

Preferably, the saddle-fin transistor is used as a cell transistor included in each unit cell.

Preferably, the sidewall of the upper electrode is surrounded with the lower electrode, and the locations of the fin region, the lower electrode and the upper electrode are determined in the semiconductor substrate by one gate mask used in a photolithography process.

According to an embodiment of the present invention, a method of fabricating a saddle-fin transistor may include performing a self-aligned etching process to form a three-dimensional channel region and a gate region where a gate electrode pattern is formed.

Preferably, the three-dimensional channel region and the gate region are formed with one gate mask.

Preferably, the method further may include forming source and drain regions with an active mask.

Preferably, the active mask is formed to be orthogonal with a pattern included in the gate mask.

Preferably, the gate mask may include patterns having various critical dimensions corresponding to gate patterns having plural sizes.

While different mask patterns have been used to form a gate and a fin region of a conventional saddle-fin transistor, in an embodiment of the present invention a fin region and a gate of a saddle-fin transistor may be formed with a gate mask pattern, thereby reducing the mis-alignment generated in a gate structure of each saddle-fin transistor.

A gate pattern may be added to form a gate structure of the transistor in the peripheral region in the gate mask pattern for forming the gate structure of the cell transistor in the core region, reducing the mis-alignment between the gate patterns of each transistor included in the core region and the peripheral region with one gate mask pattern.

In the three-dimensional transistor used as the cell transistor according to an embodiment of the present invention, not a nitride film but an oxide film is formed between a gate electrode and an active region to reduce parasitic capacitance generated between the gate electrode and the active region, thereby preventing operation defects and characteristic degradation of the semiconductor memory apparatus.

BRIEF DESCRIPTION OF THE DRAWINGS

FIGS. 4a to 4l are cross-sectional diagrams illustrating a method of fabricating a semiconductor memory apparatus according to an embodiment of the present invention by using the mask pattern of FIG. 3.

DESCRIPTION OF EMBODIMENTS

Figure 1:
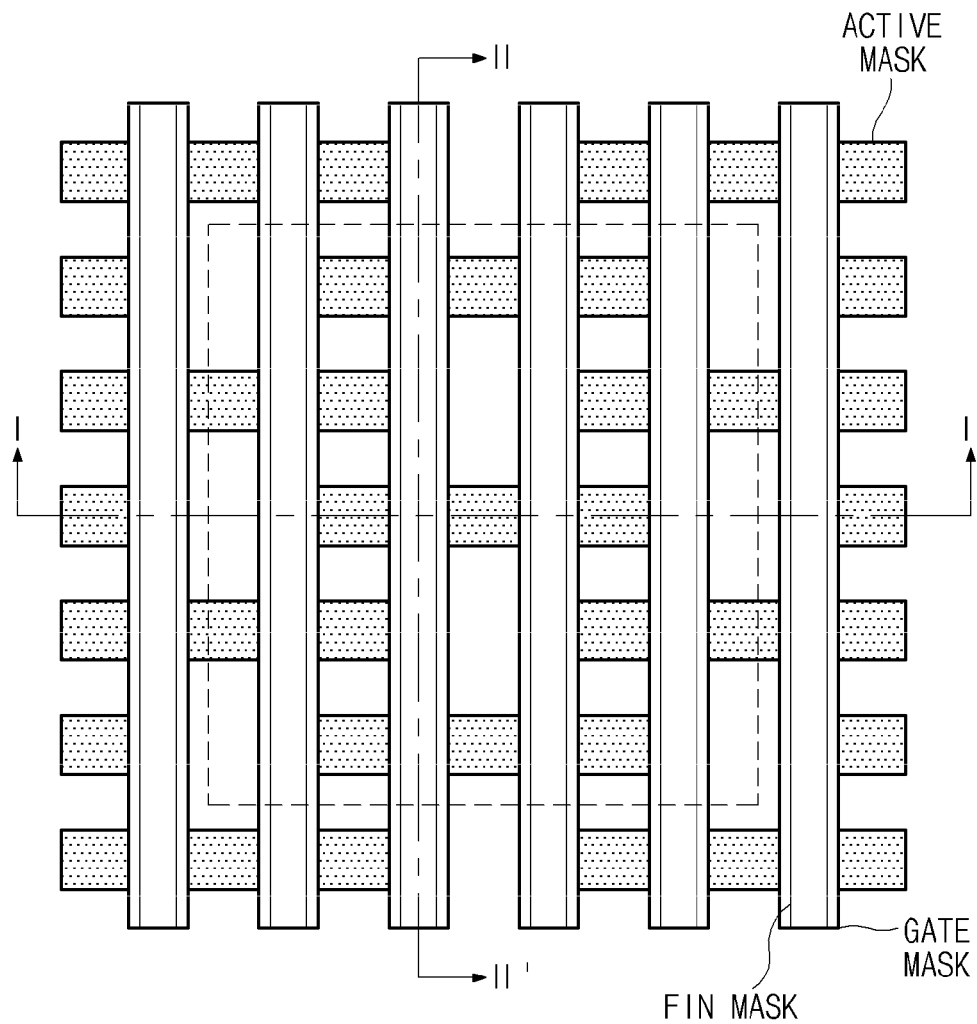
FIG. 1 is a plane diagram illustrating a mask pattern for fabricating a saddle-fin transistor of a semiconductor apparatus according to an embodiment of the present invention.
Figure 2A:
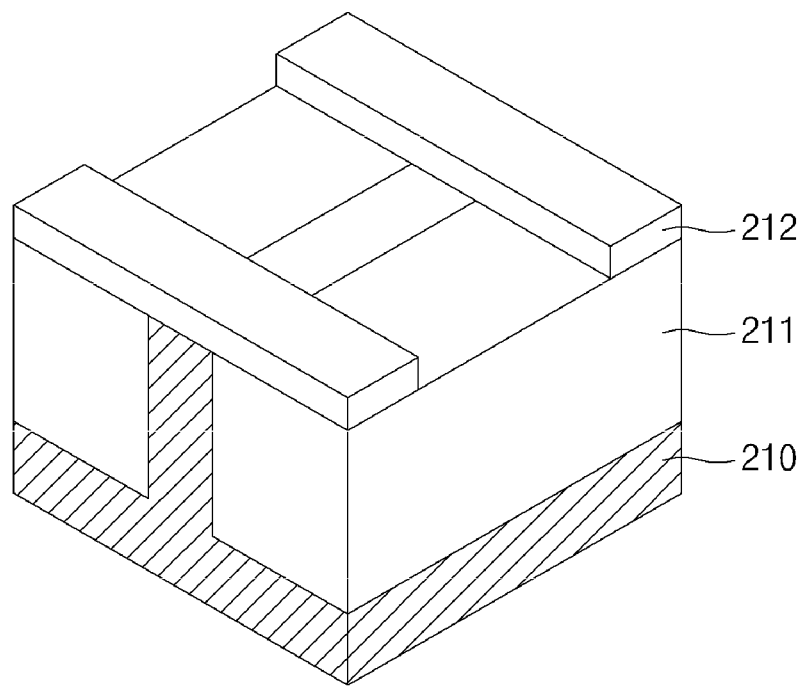
FIGS. 2a to 2f are perspective views illustrating a method of fabricating a saddle-fin transistor of a general semiconductor apparatus by using the mask pattern of FIG. 1.
Figure 2B:
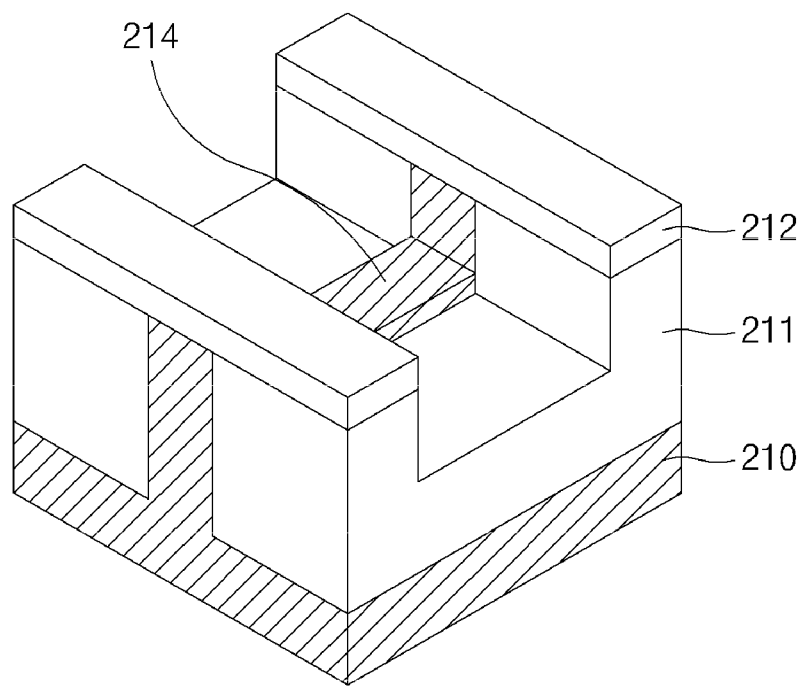
Figure 2C:
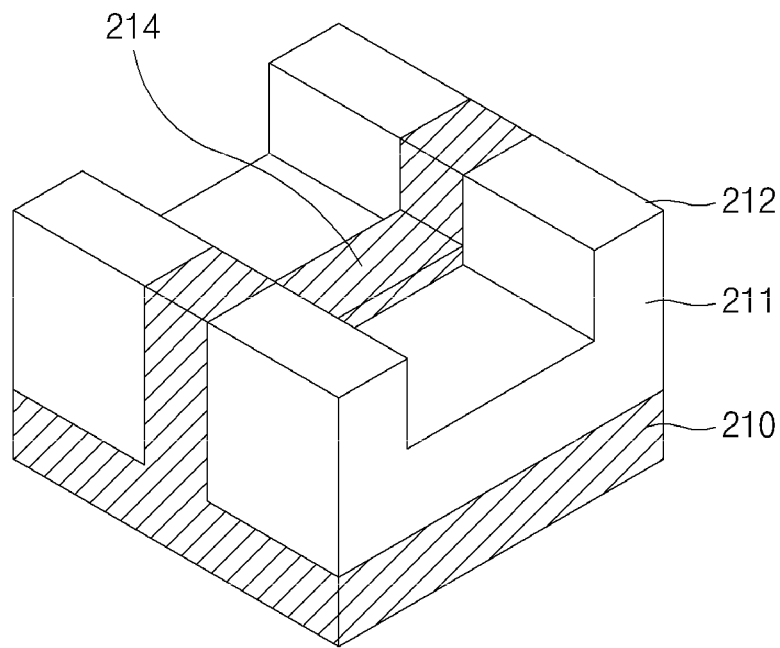
Figure 2D:
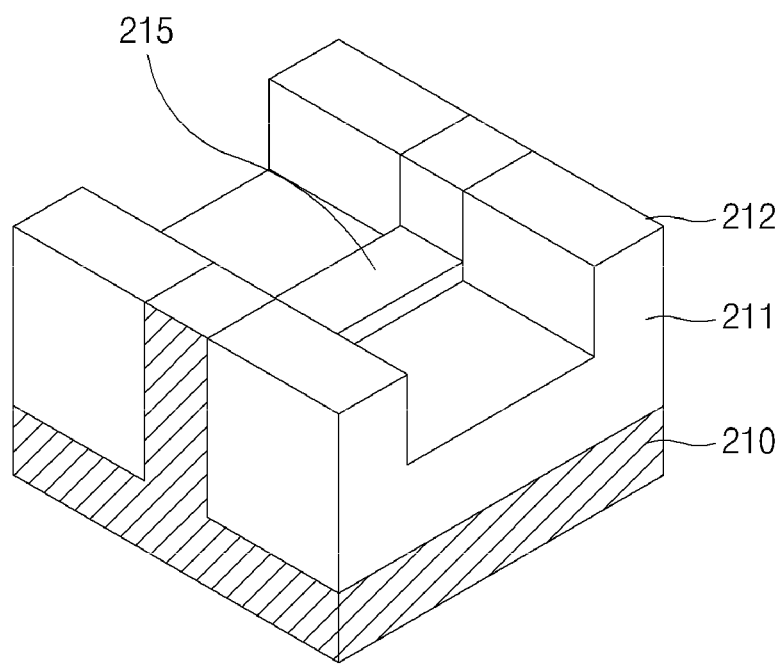
Figure 2E:
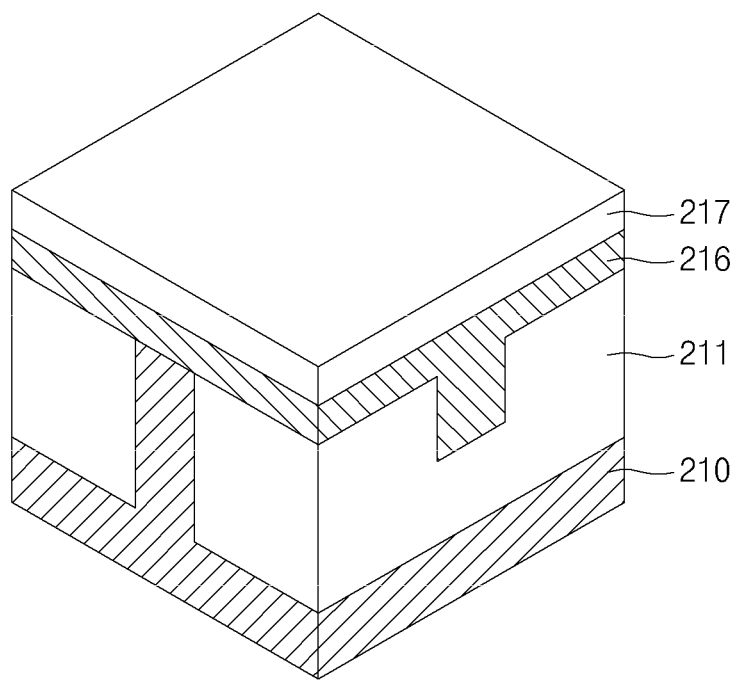
Figure 2F:
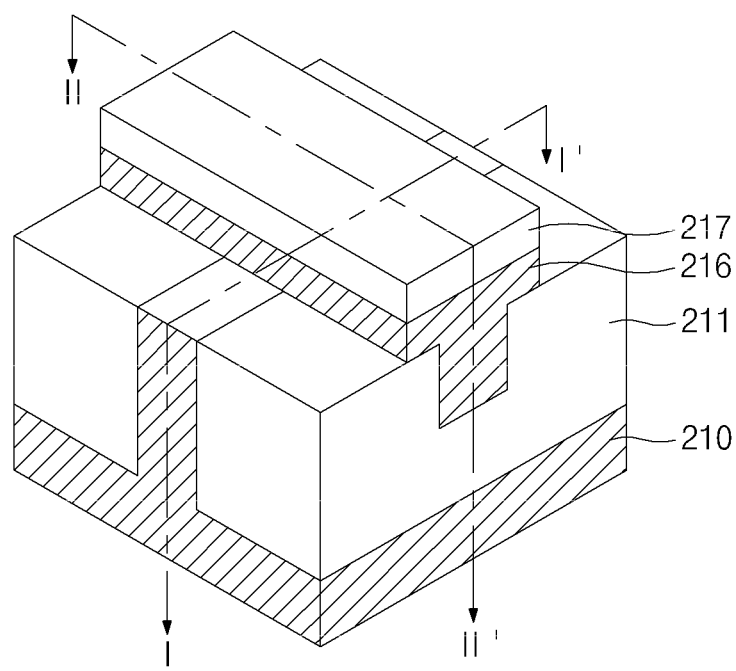

FIGS. 1 to 2f illustrate a process for fabricating a saddle-fin transistor used as a cell transistor having a three-dimensional channel structure.

FIG. 1 is a plane diagram illustrating a mask pattern for fabricating a saddle-fin transistor of a semiconductor apparatus according to an embodiment of the present invention.

As shown in FIG. 1, active masks are arranged in a horizontal direction (I-I'), and a gate mask and a fin mask are arranged in a vertical direction (II-II'). Like a common transistor, a saddle-fin transistor also may include an active region (source/drain region) and a gate region. However, the saddle-fin transistor requires an additional process of forming a fin for securing a channel length in a bottom of a gate region. The following describes a method of fabricating a saddle-fin transistor by using an active mask, a gate mask and a fin mask.

FIGS. 2a to 2f are perspective views illustrating a method of fabricating a saddle-fin transistor of a semiconductor apparatus by using the mask pattern of FIG. 1.

As shown in FIG. 2a, a shallow trench isolation (STI) process is performed to form a device isolation film 211 in a semiconductor substrate 210. Specifically, an oxidation process is performed to form a pad oxide film (not shown) over the semiconductor substrate 210, and a pad nitride film (not shown) is deposited over a pad oxide film. The semiconductor substrate 210 is etched with a mask to determine a trench region where the device isolation film 211 is formed. After an insulating film is filled in the trench formed by the etching process, a chemical mechanical polishing (CMP) process is performed to form the isolated device isolation film 211 in the trench. A photolithography process is performed to form a fin mask pattern 212. The fin mask pattern 212 is a pattern for forming a fin to increase a channel length of the saddle-fin transistor, so that the interval of the fin mask pattern 212 is formed smaller than that of a gate mask. The photolithography process for forming the fin mask pattern 212 may include a process for coating a photoresist film having a constant thickness over the semiconductor substrate 210 and the device isolation film 211, and an exposing and developing process for forming the fin mask pattern 212 by using a photo mask.

Referring to FIG. 2b, the semiconductor substrate 210 and the device isolation film 211 are etched with the fin mask pattern 212. In the condition that etching selectivity of the silicon substrate 210 and the device isolation film 211 is the highest, the device isolation film 211 is etched, then the silicon substrate 210 is etched so that a saddle-fin 214 of the silicon substrate 210 remains. When the etching selectivity is adjusted inversely, the silicon substrate 210 can be first etched, and the device isolation film 211 is etched to form the saddle-fin 214.

After the saddle-fin 214 is formed, as shown in FIG. 2c, the fin mask pattern 212 is removed. As shown in FIG. 2d, after the fin mask pattern 212 is removed, the exposed semiconductor substrate 210 and the surface of the saddle-fin 214 are oxidized to form a gate oxide film 215.

After the gate oxide film 215 is formed, gate electrode materials used as a gate of the saddle-fin transistor, that is, a polysilicon film 216 and a conductive film 217 are sequentially deposited referring to FIG. 2e. The polysilicon film 216 fills the trench (fin region) and is deposited over the semiconductor substrate 210 and the device isolation film 211 with a constant thickness. The conductive film 217 is deposited over the polysilicon film 216 with a constant thickness.

In a similar way to the fin mask pattern 212, the gate mask shown in FIG. 1 is formed over the conductive film 217. The polysilicon film 216 and the conductive film 217 are etched with the gate mask to form a gate structure of the saddle-fin transistor shown in FIG. 2f. As shown in FIG. 1, an interval between the gate mask patterns is formed to be broader than that between the fin mask patterns 212. Specifically, the fin mask keeps the mask region transparent so that light can be exposed to etch the mask region. On the other hand, the gate mask prevent light from passing through the mask region, a portion except the gate mask corresponding to gate electrode is etched.

In the case of the above-described three-dimensional saddle-fin transistor, a mask pattern for forming a fin region and a gate structure is separated, and an interval between patterns in each mask pattern is different. In forming a saddle-fin transistor in the conventional art, the fin mask pattern 212 is distinguished from the gate mask, so that the fin mask pattern 212 and the gate mask may be mis-arranged. Furthermore, the transistor is formed in a semiconductor memory apparatus as a unit cell, the mis-arrangement between the fin mask pattern 212 and the gate mask as a ratio of the design rule (mis-arrangement/design rule) increases gradually due to decrease of the design rule.

As the design rule decreases, the mis-arrangement is a burden on the manufacturing process of the semiconductor memory apparatus. As the burden of the mis-arrangement becomes larger, a process margin for fabricating the semiconductor memory apparatus is reduced. A leakage current between a gate and a bit line contact connected to a bit line (BL) junction of the cell transistor or a storage node plug connected to a storage node (SN) junction, increases to cause operation defects of the cell transistor. The gate structure formed by the gate mask pattern may lean to one of the bit line junction or the storage node junction, which may degrade characteristics of the cell transistor in the semiconductor memory apparatus.

In addition to the mis-arrangement between the fin region and the gate structure of the three-dimensional saddle-fin transistor possible in the above-described cell transistor, a core region including the unit cell and a peripheral region including input/output circuits may be mis-arranged while a different-sized transistor is formed as the design rule is decreased. In order to reduce the manufacturing process and time of the semiconductor memory apparatus, it is desirable to perform the common process in forming a transistor included in the core region and the peripheral region not on the individual region but on the common regions. In other words, as the design rule is gradually decreased, the core region and the peripheral region may be mis-arranged. The mis-arrangement may affect the whole performance of the semiconductor memory apparatus. Moreover, the increase in process steps so as to prevent the mis-arrangement degrades productivity.

Figure 3A:
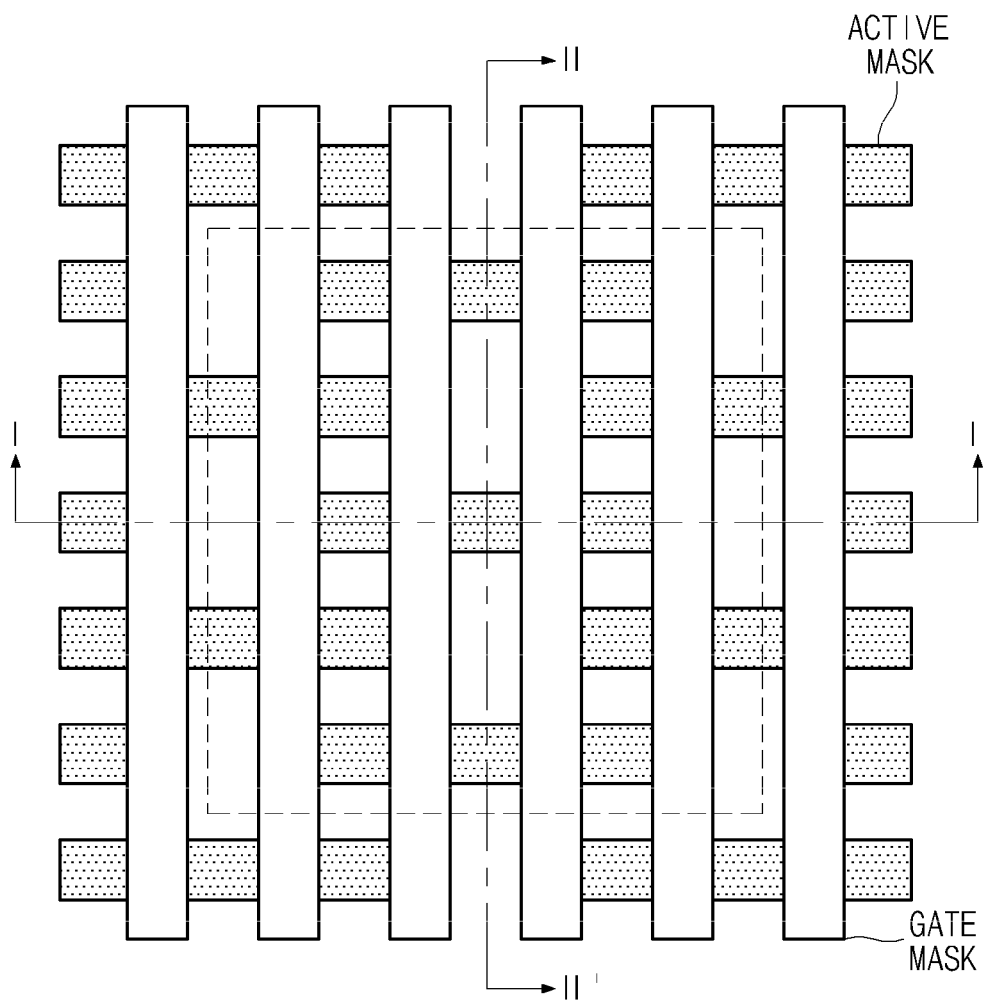
FIGS. 3a to 3c are plane diagrams illustrating a mask pattern for fabricating a saddle-fin transistor in a semiconductor apparatus according to an embodiment of the present invention.
Figure 3B:
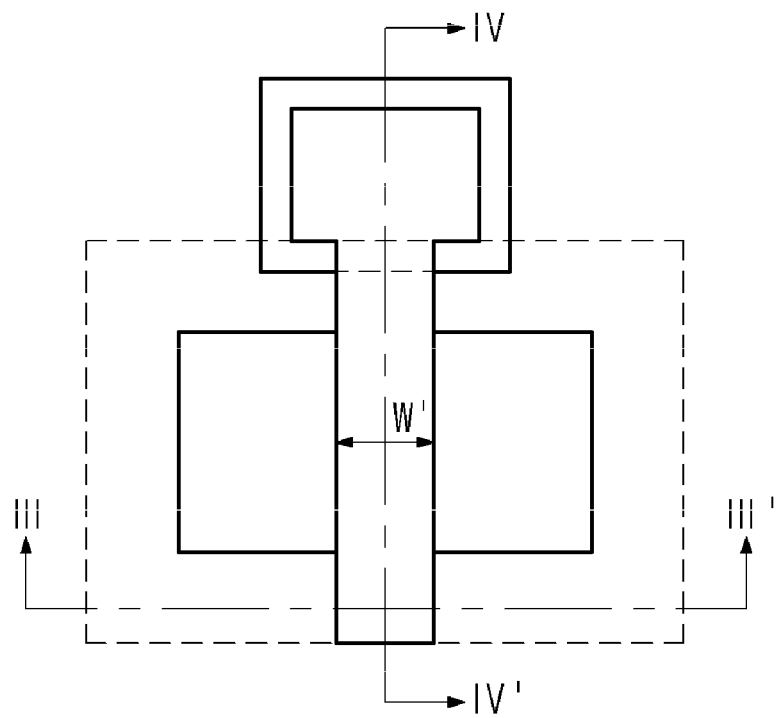
Figure 3C:
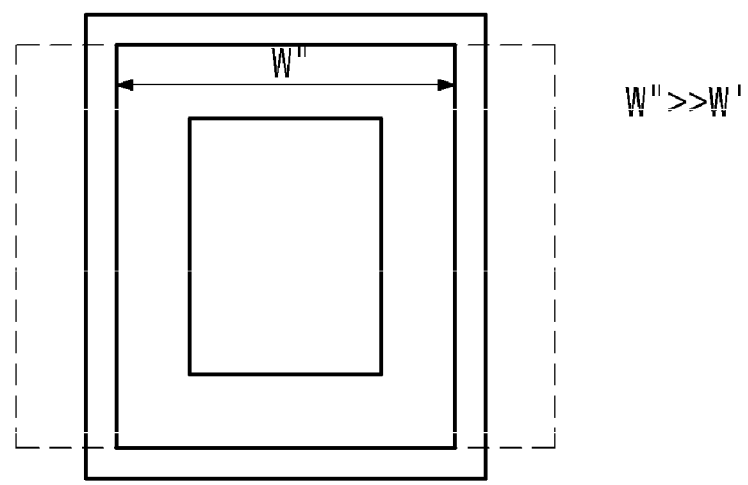

FIGS. 3a to 3c are plane diagrams illustrating a mask pattern for fabricating a saddle-fin transistor in a semiconductor apparatus according to an embodiment of the present invention.

Referring to FIG. 3a, a mask pattern for fabricating a saddle-fin transistor may include an active mask for forming source/drain regions and a gate mask for forming a gate region, which are two photoresist masks. The active mask and the gate mask are formed to be orthogonal with each other. The saddle-fin transistor may include a fin region formed to increase a channel length in a bottom portion of a gate electrode. In order to form the fin region and the gate electrode, a fin mask for forming the fin region and a gate mask for forming a gate electrode have been required so far. However, in the embodiment of the present invention, the fin region and the gate electrode can be formed with one mask to prevent the mis-arrangement generated when the two masks are used.

In the case of the semiconductor memory apparatus according to one embodiment of the present invention, the saddle-fin transistor is used as a cell transistor included in each unit cell. While the cell transistor is formed with the gate mask shown in FIG. 3a, FIGS. 3b and 3c illustrate the gate mask for forming a transistor gate having various sizes included in the semiconductor memory apparatus. In the semiconductor memory apparatus, various-sized transistors are disposed depending on their functions and locations. The masks shown in FIGS. 3b and 3c are used in forming a gate of a transistor larger than the cell transistor included in the core region and the peripheral region.

In the embodiment of the present invention, one gate mask determines the location of plural transistors comprising the saddle-fin transistor included in the semiconductor memory apparatus. That is, a photolithography process is performed on one gate pattern that may include a pattern for forming the saddle-fin transistor shown in FIG. 3a and various-sized patterns shown in FIG. 3b and FIG. 3c, thereby reducing the mis-arrangement between the gate patterns of the transistor included in the core region and the peripheral region. the gate mask of the present invention is formed to have a transparent shape so that a portion formed as a gate region can be etched by light. A critical dimension of the gate can be formed to be similar to or smaller than that of the conventional art.

A method of fabricating a saddle-fin transistor formed as a cell transistor and various-sized transistors formed in the core region and the peripheral region is described with reference to cross-sectional diagrams in a X direction (I'-I") and in a Y direction (II'-II").

FIGS. 4a to 4l are cross-sectional diagrams illustrating a method of fabricating a semiconductor memory apparatus according to an embodiment of the present invention by using the mask pattern of FIG. 3.

Figure 4A:
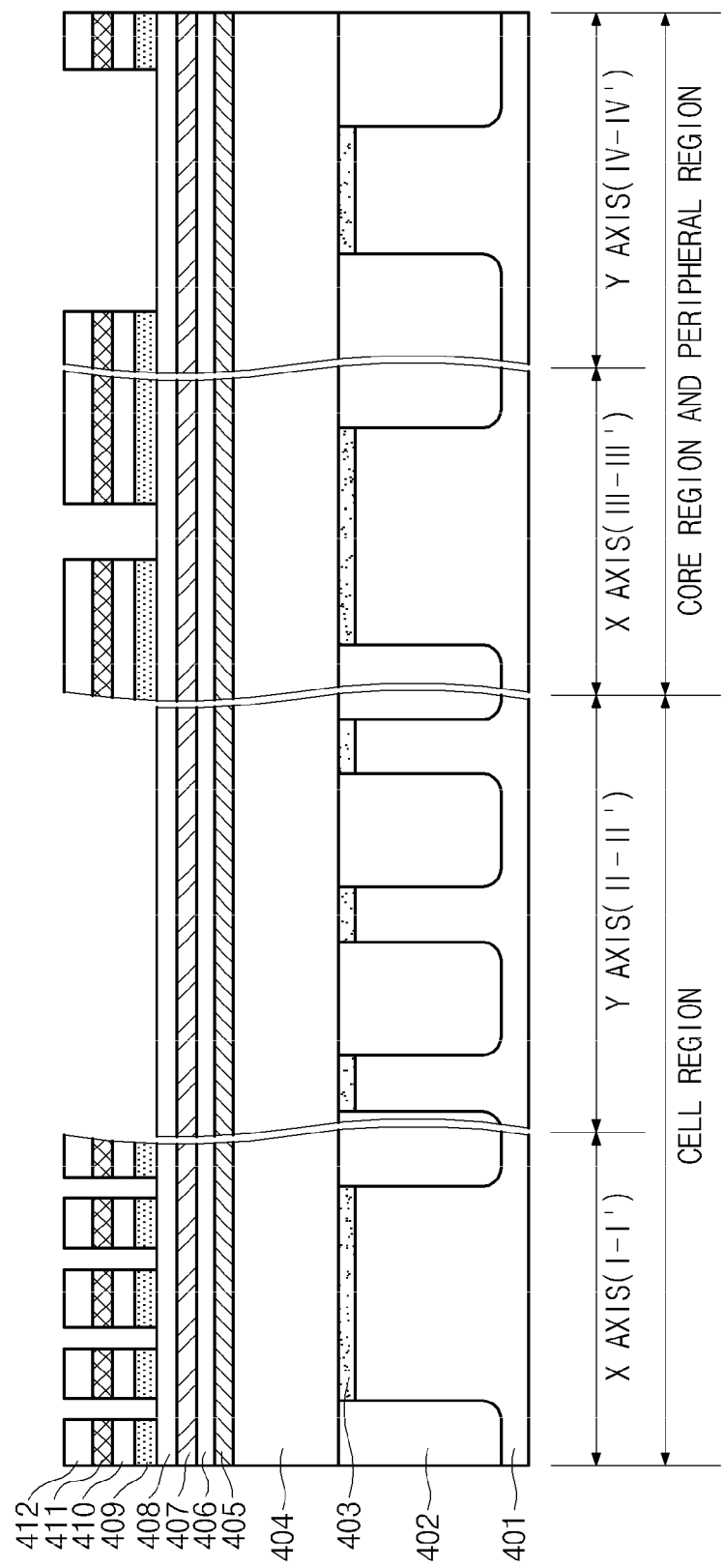

Referring to FIG. 4a, a shallow trench isolation (STI) process is performed on a semiconductor substrate 401 to form a device isolation film 402. In the STI process, an oxidation process is performed on the silicon substrate 401 to form a pad oxide film (not shown), and a pad nitride film (not shown) is deposited over the pad oxide film. An etching process is performed on the pad nitride film with an active mask to form a trench in the silicon substrate 401. An insulating film is deposited to fill the trench, and a chemical mechanical polishing (CMP) process is performed to expose the pad nitride film, so that the device isolation film 402 is formed in the silicon substrate 401. After the CMP process, the exposed pad nitride film is removed, and the exposed pad oxide film is also removed.

While the pad nitride film and the pad oxide film are removed, a buffer oxide film 403 is formed over the exposed semiconductor substrate 401. After the buffer oxide film 403 is formed, a photolithography process is performed on a place where a transistors between the plural device isolation films 402 formed in the semiconductor substrate 401 are formed by using an implant mask for forming a well and a channel region, thereby implanting impurities. After the well and the channel region are formed, the residual photoresist film (not shown) is removed.

A first hard mask oxide film 404 is deposited to have a height of the gate structure formed in the semiconductor memory apparatus over the buffer oxide film 403 and the device isolation film 402. A first hard mask polysilicon film 405 is deposited over the first hard mask oxide film 404. The first hard mask polysilicon film 405 has a different etching selectivity from that of the first hard mask oxide film 404.

At least one or more combinations of the hard mask oxide film and the hard mask polysilicon film are deposited over the first hard mask polysilicon film 405. Referring to FIG. 4a, a second hard mask oxide film 406, a second hard mask polysilicon film 407, a third hard mask oxide film 408, and a third hard mask polysilicon film 409 are sequentially deposited in the method of fabricating a semiconductor memory apparatus according to an embodiment of the present invention. The second and third hard mask oxide films 406, 408 and the second and third hard mask polysilicon films 407, 409 are used as self-aligned masks in a subsequent etching process for forming a gate pattern.

An antireflection film 410 comprising a silicon oxynitride (SiON) film is deposited over the third hard mask polysilicon film 409, and a fourth hard mask polysilicon film 411 is deposited over the antireflection film 410. After a photoresist film is deposited over the fourth hard mask polysilicon film 411, a first photoresist film 412 shown in FIG. 4a is formed by a photolithography process by using the gate mask shown in FIGS. 3a~3c.

In another embodiment of the present invention, a silicon film (not shown) doped with N-type or P-type impurities may be used instead of the first to fourth hard mask polysilicon films 405, 407, 409, 411 which are not doped with impurities. Also, the first to fourth hard mask polysilicon films 405, 407, 409, 411 can be nitrified under an ammonia gas atmosphere or ion-implanted with nitrogen ions so that an oxide film may not be formed during an oxidation process.

In still another embodiment of the present invention, the first to third hard mask films 404, 406, 408 may comprise not hard mask oxide films but SiON films. Preferably, a plurality of hard mask layers comprise two kinds of materials which are alternately deposited with a different etching selectivity.

The fourth hard mask polysilicon film 411, the antireflection film 410, and the exposed portion of the third hard mask polysilicon film 409 are sequentially etched with the first photoresist film 412. A dry etching process for applying a bias voltage is performed to improve a vertical characteristic (vertical cross-sectional characteristic) of the mask pattern that may include the fourth hard mask polysilicon film 411, the antireflection film 410 and the third hard mask polysilicon film 409.

Referring to FIG. 4a, the processes of forming the device isolation film 402 in the semiconductor substrate 401, of depositing a plurality of hard mask oxide films and hard mask polysilicon films, and of etching the third hard mask polysilicon film 409 are performed on the whole semiconductor memory apparatus. That is, the above-described processes are performed on the region for forming the saddle-fin transistor used as a cell transistor or on the core region or the peripheral region for forming different kinds of transistors. Depending on the location and the function in the semiconductor memory apparatus, the width and size of the region for forming a gate of the transistor are different. The photolithography process by using one gate mask determines the location of all transistors formed in the semiconductor memory apparatus to reduce the mis-arrangement between the transistors.

After the location of the transistors is determined in the semiconductor memory apparatus, the photoresist film is covered except the region for forming the saddle-fin transistor, that is, the cell transistor. That is, the photoresist gate pattern 412 is removed, and a photoresist film 413 is deposited over the semiconductor memory apparatus. Then, the region for forming the saddle-fin transistor is exposed with a cell open mask. The third hard mask oxide film 408 exposed in the cell region (that is, the region for forming the cell transistor) between the mask patterns includes the fourth hard mask polysilicon film 411, the antireflection film 410, and the third hard mask polysilicon film 409 is blanket-etched. The etching selectivity is adjusted to remove the third hard mask oxide film 408 so that the fourth hard mask polysilicon film 411, which is the top layer of the mask pattern, may not be removed.

When the third hard mask oxide film 408 exposed in the cell region is removed, the photoresist film 413 that covers the regions other than the cell region, the core and peripheral regions is removed. As shown in FIG. 4c, the second hard mask polysilicon film 407, which is exposed when the third hard mask oxide film 408 in the cell region is removed, is etched. During the etching process, the etching selectivity is adjusted not to remove the antireflection film 410 which is the top layer of the mask pattern. Since the photoresist film 413 has been removed, the third hard mask polysilicon film 411 included in the top layer of the mask pattern of the rest region in the semiconductor memory apparatus except the cell region is etched along with the second hard mask polysilicon film 407. As a result, as shown in FIG. 4c, the self-aligned mask of all regions in the semiconductor memory apparatus has the same height as that of the mask pattern comprising the antireflection film 410 as the top layer. However, the cell region has a structure where the second hard mask polysilicon film 407 and the third hard mask oxide film 408 are further etched. Using a structural difference of the self-aligned mask etched between the cell region and the core and peripheral regions, the fin region of the saddle-fin transistor positioned only in the cell region can be formed in the semiconductor substrate 401.

Figure 4B:
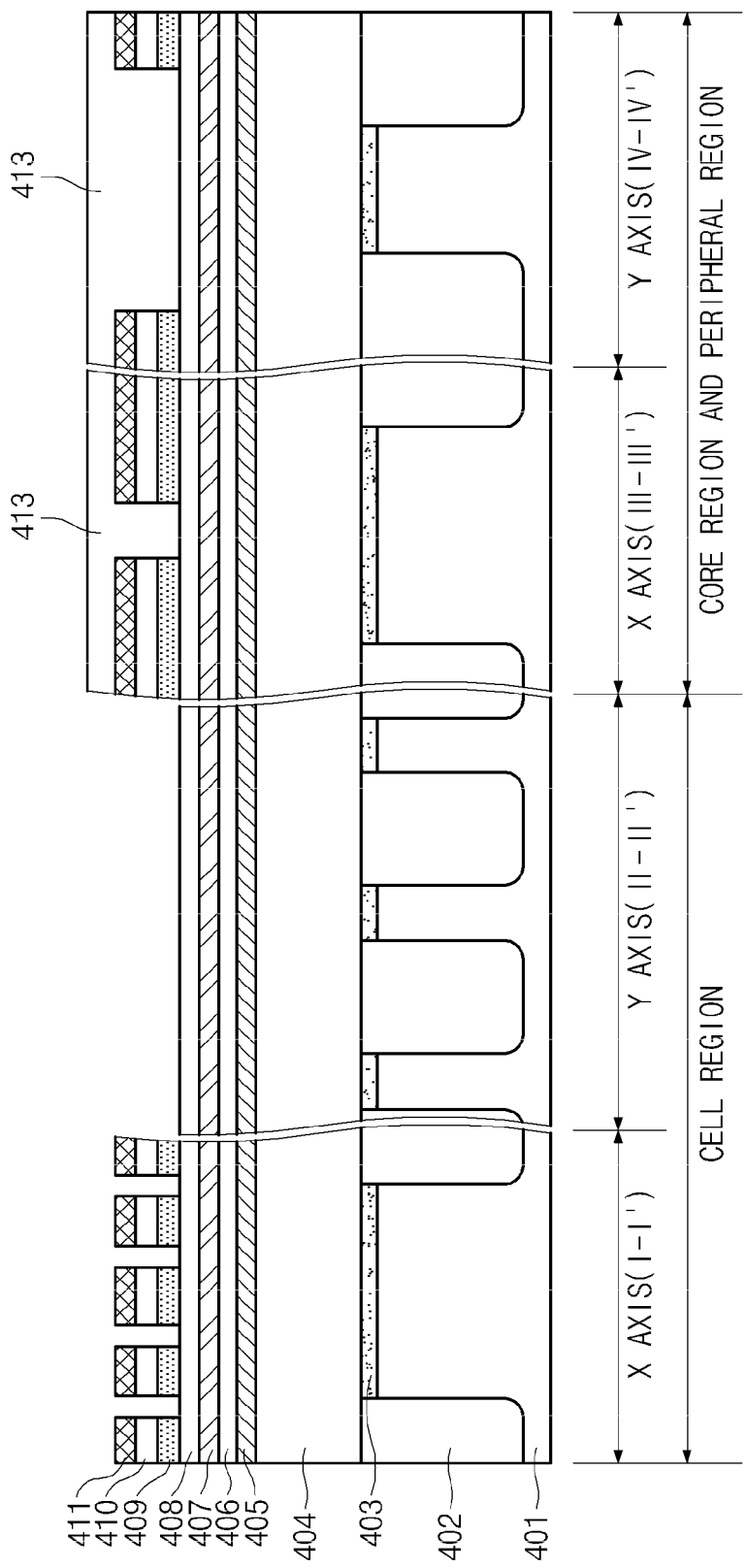
Figure 4C:
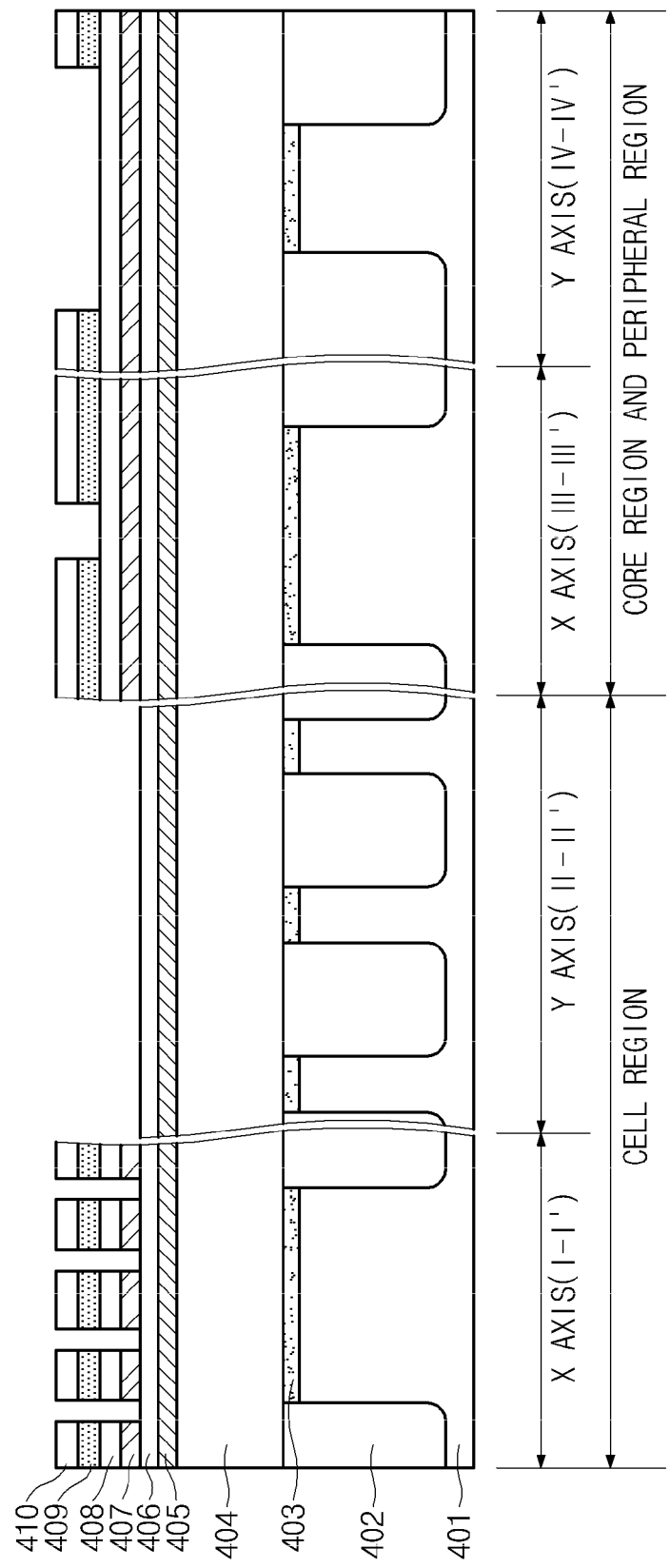
Figure 4D:
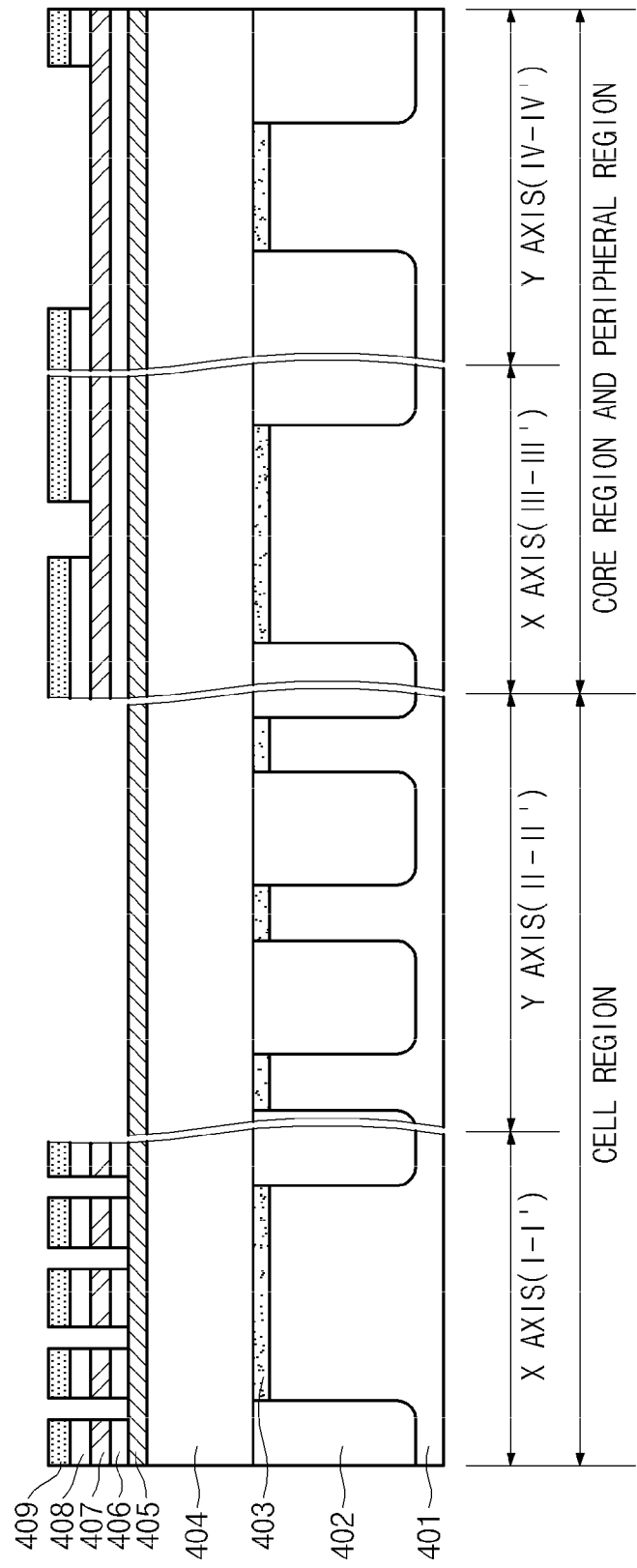

As shown in FIG. 4d, the second hard mask oxide film 406 and the antireflection film 410 exposed in the cell region, and the third hard mask oxide film 408 and the antireflection film 410 exposed in all regions (the core region and the peripheral region) except the cell region are etched.

Figure 4E:
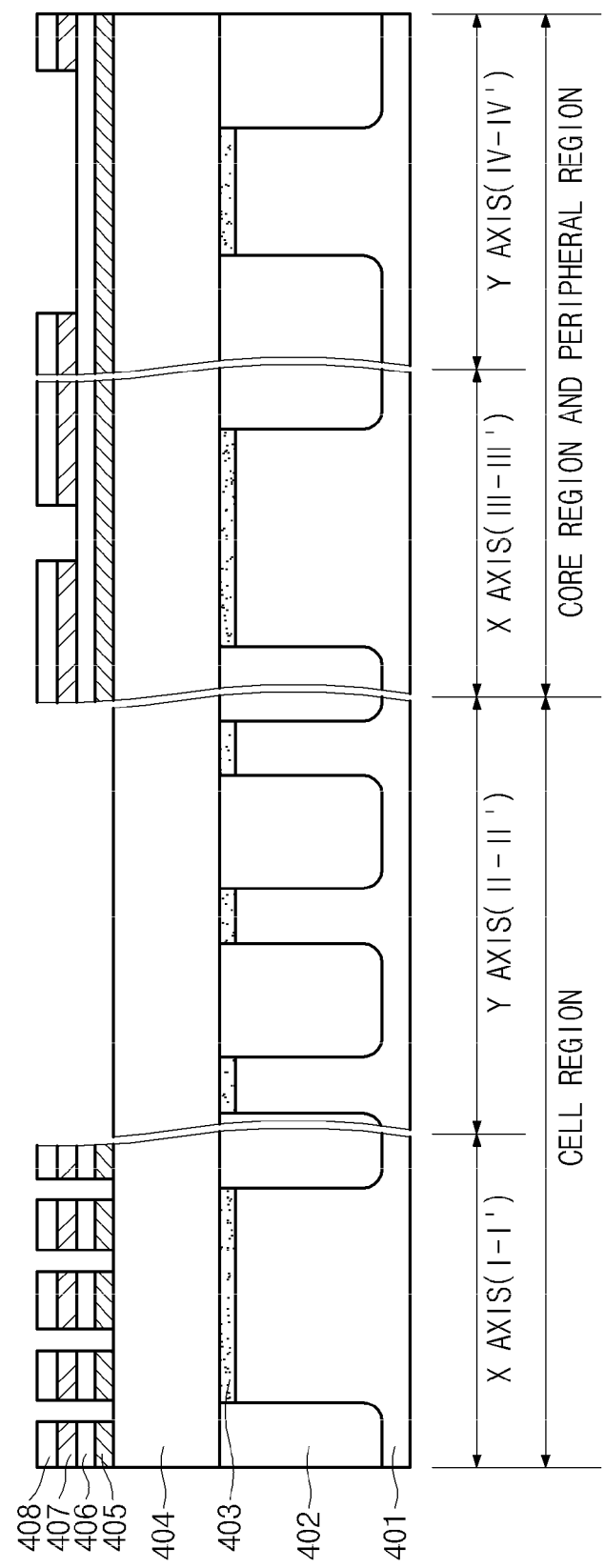

As shown in FIG. 4e, the first to third hard mask polysilicon films 405, 407, 409 exposed in the semiconductor substrate are etched by adjusting the etching selectivity. Specifically, the first hard mask polysilicon film 405 exposed in the cell region, the second hard mask polysilicon film 407 exposed in the other regions (the core region and the peripheral region), and the third hard mask polysilicon film 409 included in the top layer of the self-aligned mask of all regions of the semiconductor memory apparatus are removed.

Figure 4F:
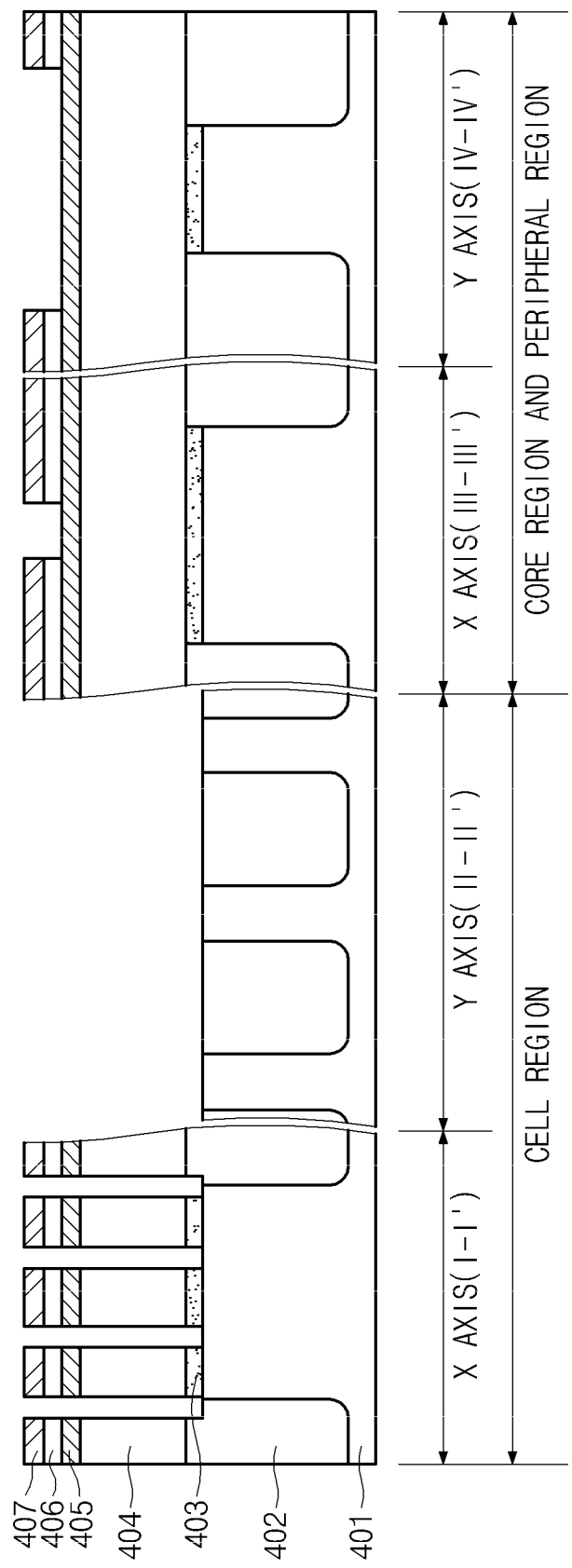

Referring to FIG. 4f, the first to third hard mask oxide films 404, 406, 408 exposed in the semiconductor substrate are etched by adjusting the etching selectivity unlike FIG. 4e, and the buffer oxide film 403 exposed in the cell region is etched. Specifically, the first hard mask oxide film 404 exposed in the cell region, the second hard mask oxide film 406 exposed in the core and peripheral regions, and the third hard mask oxide film 408 included in the top layer of the self-aligned mask are removed. By adjusting the etching selectivity, the buffer oxide film 403 is further etched along with the hard mask oxide film so as to form a fin region in the cell region. The second hard mask polysilicon film 407 disposed over the self-aligned mask of the cell region and the core and peripheral regions is not etched.

Figure 4G:
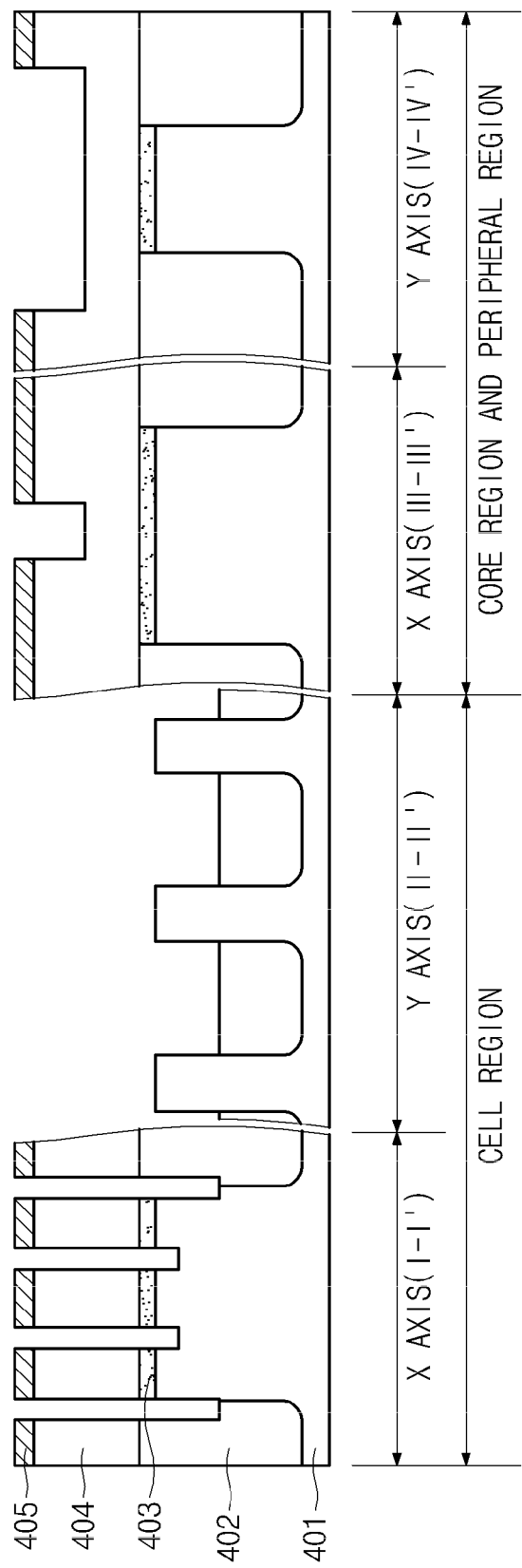

Referring to FIG. 4g, the second hard mask polysilicon film 407 and the exposed semiconductor substrate 401, which are the upper portions of the self-aligned mask in the cell region, and the second hard mask polysilicon film 407 and the exposed first hard mask polysilicon film 405, which are the upper portion of the self-aligned mask in the core and peripheral regions, are simultaneously etched. The etched degree is targeted to a range where the fin region to be formed in the semiconductor substrate 401 is formed. For this target, when the first hard mask polysilicon film 405 shown in FIG. 4a is deposited, the deposition thickness is determined under consideration of the depth of the fin region. For example, the deposition thickness of the first hard mask polysilicon film 405 is similar to or smaller than the depth of the fin region (that is, the etch depth of the semiconductor substrate 401). As a result, the three-dimensional channel region, the fin region, and the gate region where a gate electrode pattern is formed are simultaneously formed in the cell region of the saddle-fin transistor, thereby preventing the mis-arrangement between the gate electrode pattern and the channel region.

After the region corresponding to the fin region in the semiconductor substrate 401 is etched, the device isolation film 402 is etched so as to form a fin of the saddle-fin transistor structure. After the device isolation film 402 is etched, referring to a Y-axis cross-section of FIG. 4g, the fin structure in the channel region is formed. When the device isolation film 402 is etched, the second hard mask oxide film 406, which is the upper portion of the self-aligned mask in the cell region, is also removed. Even in the core region and the peripheral region except the cell region, the second hard mask oxide film 406, which is the upper portion of the self-aligned mask, is removed, and the first hard mask oxide film 404 exposed between the self-aligned masks is etched. In the etched degree of the device isolation film 402, the thickness of the first hard mask oxide film 404 (corresponding to the height of the gate electrode and the gate hard mask nitride film) is higher than the etched depth of the device isolation film 402. As shown in FIG. 4g, the first hard mask oxide film 404 is not all etched but remains partially.

Figure 4H:
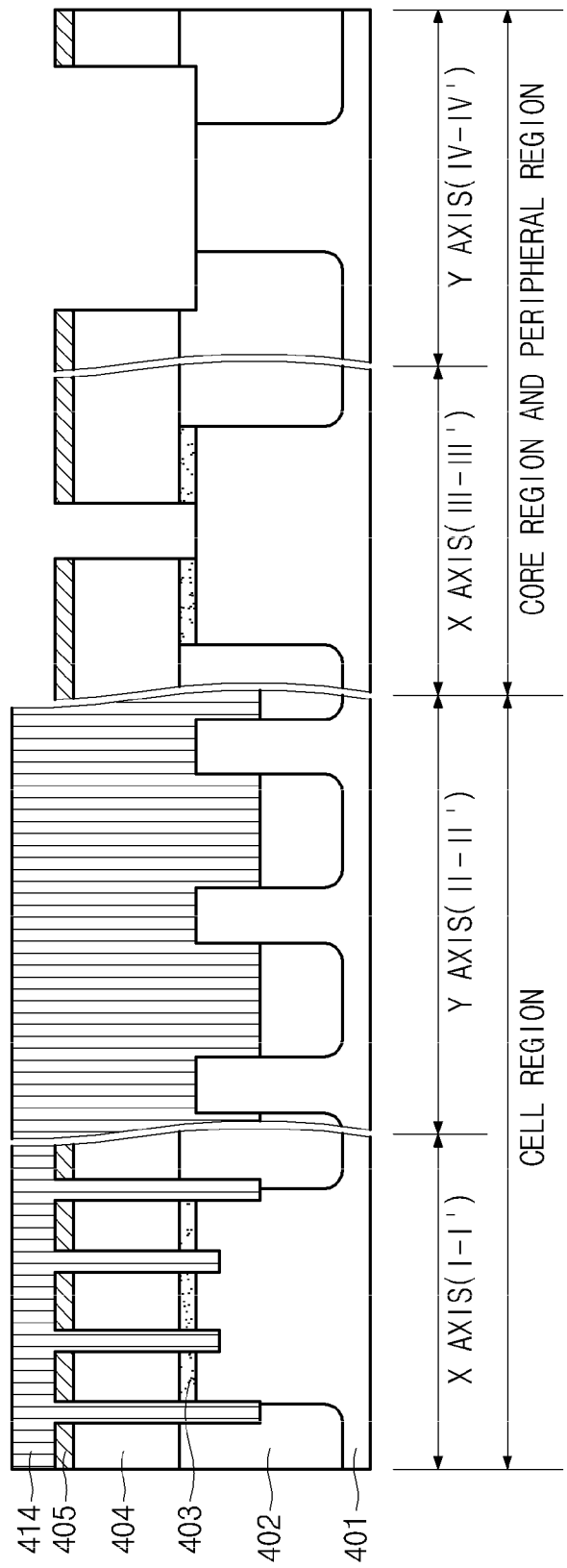

As a result, an additional process is required to remove the residual first hard mask oxide film 404 exposed between the self-aligned masks in the core region and the peripheral region except the cell region. As shown in FIG. 4h, the cell region is covered with a third photoresist film 414, and the first hard mask oxide film 404 exposed in the core region and the peripheral region is etched. The buffer oxide film 403 exposed after the first hard mask oxide film 404 is etched is also etched. Then, the third photoresist film 414 that covers the cell region is removed.

Through the above-described process, the fin region and the gate region for forming the saddle-fin transistor are secured in the cell region, and the gate region of the transistor is secured in the core region and the peripheral region except the cell region.

Figure 4I:
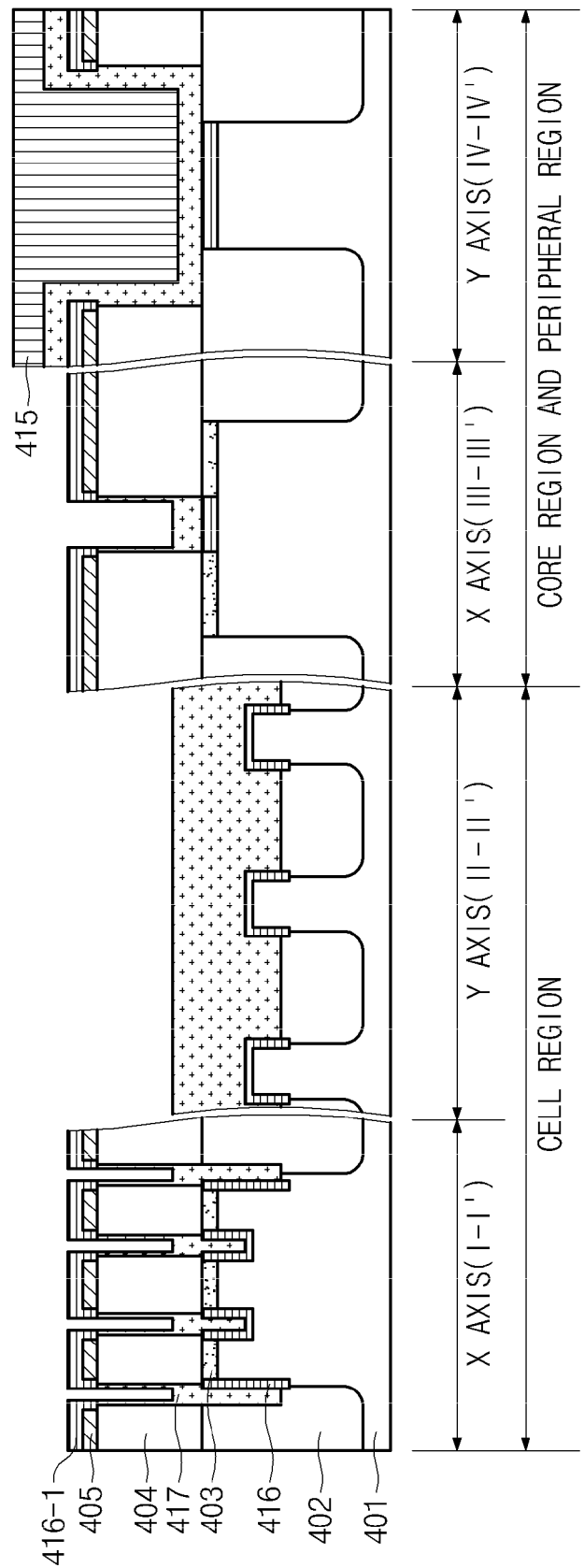

As shown in FIG. 4i, the semiconductor substrate 401 exposed in the cell region, the core region and the peripheral region is oxidized to form a gate insulating film 416. An oxide film 416-1 is formed in the first hard mask polysilicon film that remains over the self-aligned mask as well as the semiconductor substrate 401. After the gate insulating film 416 is formed, a gate lower electrode 417 is deposited. Specifically, after the gate lower electrode 417 is deposited, a new photoresist film 415 is covered only over the gate region of the core region and the peripheral region where the width of the gate electrode is broad. The other regions are etched so that the gate lower electrode 417 may remain with a given height over the semiconductor substrate 401. The etching process is performed because in formation of a double gate structure including a lower electrode and an upper electrode, consisting of a different material, when the width of the gate electrode is narrow in the deposition of the gate lower electrode 417, a region for forming the gate electrode is buried not to facilitate formation of a gate upper electrode.

Figure 4J:
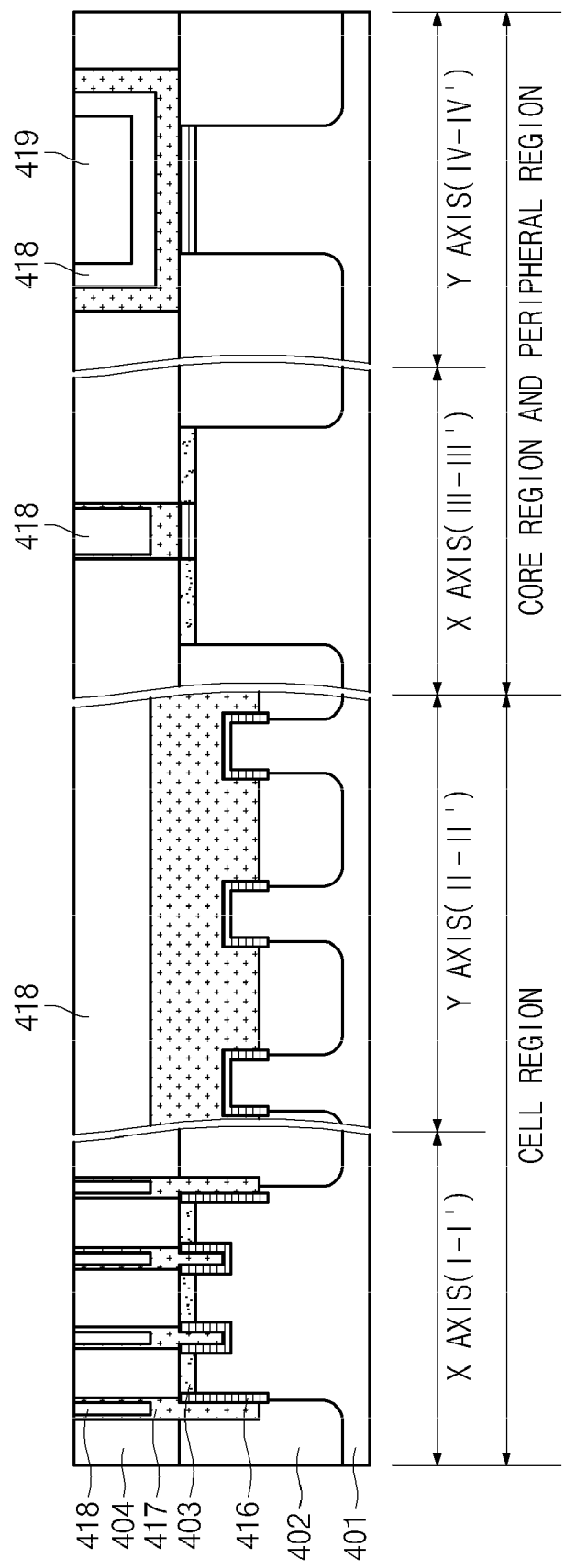

As shown in FIG. 4i, after the gate lower electrode 417 is formed, the photoresist film 415 that covers the core region and the peripheral region where the width of the gate electrode is broad is removed and washed. As shown in FIG. 4j, a gate upper electrode 418 is deposited with a given thickness over the gate lower electrode 417. Depending on the location and function in the semiconductor memory apparatus, the size and thickness of the gate upper electrode 418 can be different, so that the gate electrode region is not filled full even when the gate upper electrode 418 is deposited with a constant thickness. As shown in FIG. 4j, when the gate electrode region is broad, the gate region may not be filled full due to the deposition of the gate upper electrode 418. As a result, an insulating film 419 is deposited over the gate upper electrode 418. If the insulating film 419 is not deposited and the planarizing and etching process is performed, the height of the region where the gate electrode of the transistor in the semiconductor memory apparatus is formed can be different. Through a subsequent etching process, the gate electrode region having a low height can be over-etched to expose the semiconductor substrate 401 resulting in a defect.

Figure 4K:
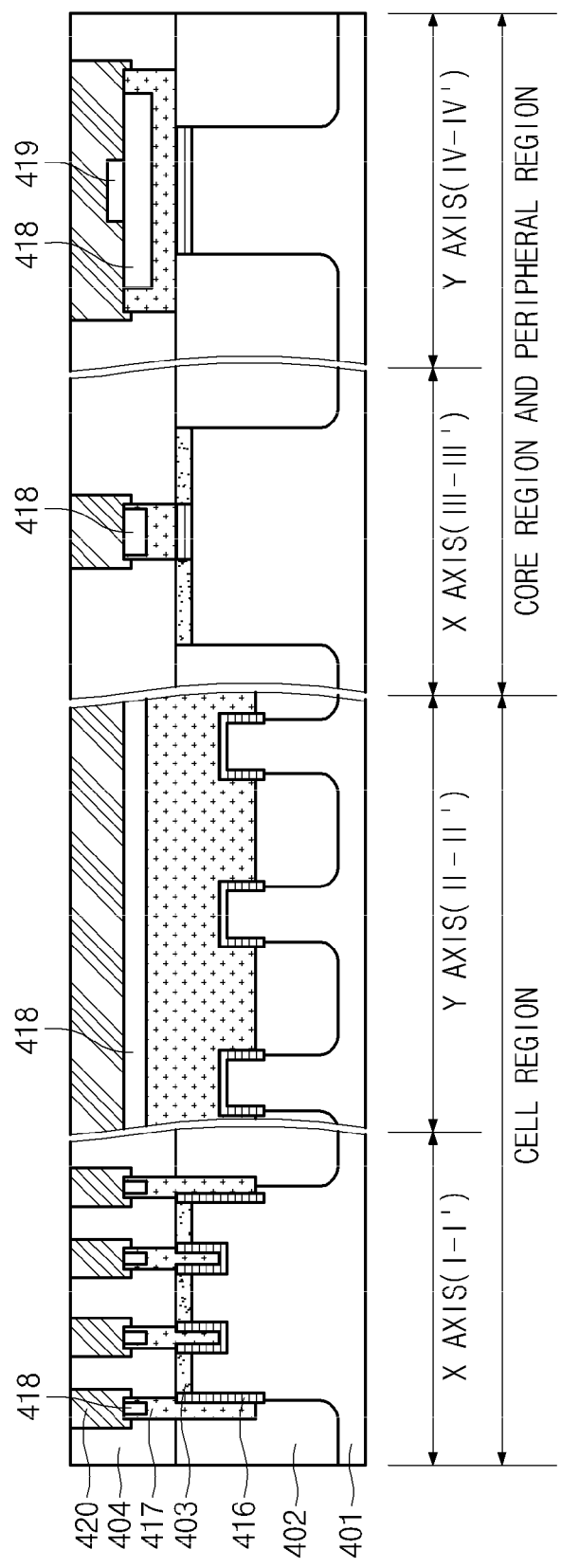
Figure 4I:
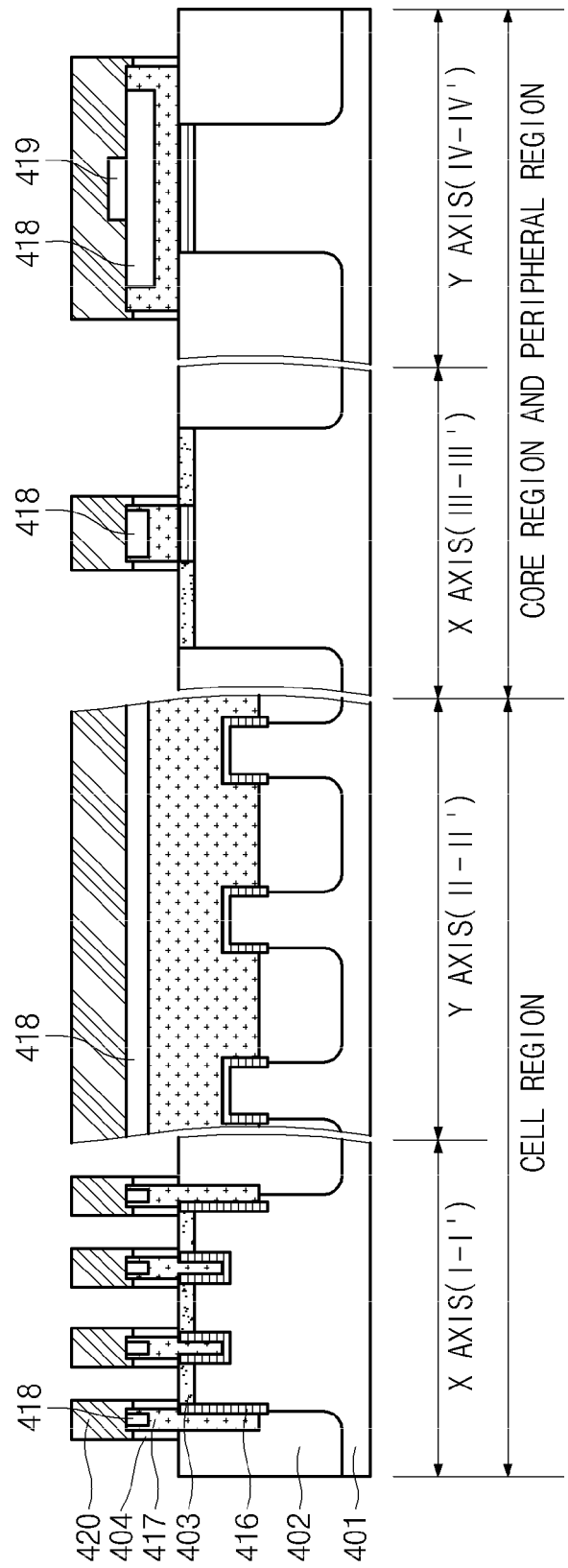

A CMP process is performed to expose the first hard mask oxide film 404. Then the first hard mask oxide film 404, the gate lower electrode 417, and the gate upper electrode 418 are exposed over the planarized semiconductor structure. Referring to FIG. 4k, the upper portion of the gate upper electrode 418 and the gate lower electrode 417 are etched so that the gate upper electrode 418 may remain with a constant height over the gate lower electrode 417. The first hard mask oxide film 404 is wet-etched through a space generated when the upper portion of the gate upper electrode 418 and the gate lower electrode 417 are partially etched. As shown in FIG. 4k, a gate hard mask nitride film 420 is deposited in the expanded space, and a CMP process is performed to expose the first hard mask oxide film 404. The first hard mask oxide film 404 is wet-etched to expand a space by the gate hard mask nitride film 420, so that the gate hard mask nitride film 420 may be formed to have a broader width than that of the gate lower electrode 417 and the gate upper electrode 418.

Referring to FIG. 4l, the first hard mask oxide film 404 is etched with the gate hard mask nitride film 420 as a mask in the semiconductor memory apparatus, thereby exposing the buffer oxide film 403 and the device isolation film 402. Since the etching process is performed with the gate hard mask nitride film 420, a portion of the first hard mask oxide film 404 that surrounds the gate lower electrode 417 remains. In this way, the etching process of the first hard mask oxide film 404 is performed to form a gate pattern in the cell region, the core region and the peripheral region.

After the gate pattern is formed, a lightly doped drain (LDD) region (not shown) and a sidewall insulating film (not shown) may be further formed in the cell region, the core region and the peripheral region. Impurities are ion-implanted into both sides of the gate pattern by using the buffer oxide film 403 to form source/drain regions.

As described above, the method of fabricating a semiconductor memory apparatus according to an embodiment of the present invention may prevent generation of device defects due to mis-arrangement of a gate mask and a fin mask and of degradation of device characteristics, when a gate pattern and a fin region of a saddle-fin transistor are formed only by using one gate mask. The locations of all transistors formed in a region for forming a cell transistor including a saddle-fin transistor and in core and peripheral regions for forming various-sized transistors are determined by using one gate mask to prevent the mis-arrangement generated between the transistors.

Although transistors are formed in the cell region and other regions of the semiconductor memory apparatus according to an embodiment of the present invention, when only a saddle-fin transistor is formed in the semiconductor apparatus, it is unnecessary to form the second photoresist film 413 shown in FIG. 4b and expose the cell region through a cell open mask or to cover the cell region with the third photoresist film 414 shown in FIG. 4h and remove the first hard mask oxide film 404 exposed in other regions.

As mentioned above, the method of forming a saddle-fin transistor according to an embodiment of the present invention may include: forming the buffer oxide film 403 and the hard mask oxide film 404 over the semiconductor substrate 401; etching the buffer oxide film 403, the hard mask oxide film 404 and the semiconductor substrate 401 corresponding to the gate mask pattern to form a trench corresponding to the gate electrode and the fin region; oxidizing the semiconductor substrate 401 exposed in the trench to form an oxide film which is the gate insulating film 416; depositing the gate lower electrode 417 in the trench; and depositing the gate upper electrode 418 over the gate lower electrode 417 to fill the trench. Unlike the conventional art, the fin region and the gate electrode are formed by using only a gate mask without a fin mask in manufacturing of the saddle-fin transistor.

FIGS. 5a to 5d are cross-sectional diagrams illustrating a method of fabricating a semiconductor memory apparatus according to another embodiment of the present invention by using the mask pattern of FIG. 3.

Figure 5A:
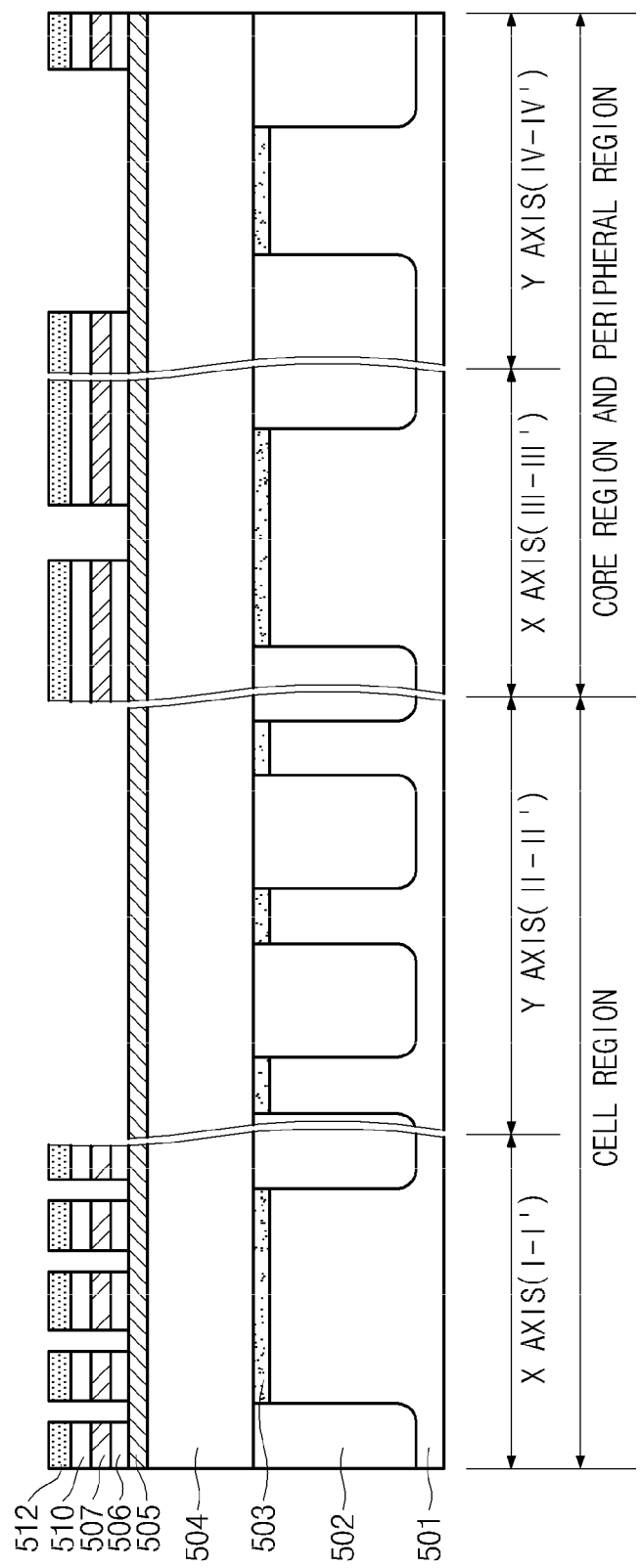
FIGS. 5a to 5d are cross-sectional diagrams illustrating a method of fabricating a semiconductor memory apparatus according to another embodiment of the present invention by using the mask pattern of FIG. 3.

Referring to FIG. 5a, a STI process is performed on a semiconductor substrate 501 to form a device isolation film 502. Over the device isolation film 502, a buffer oxide film 503, a first hard mask oxide film 504, a first hard mask polysilicon film 505, a second hard mask oxide film 506, and a second hard mask polysilicon film 507 are deposited, which is similar to the process shown in FIG. 4a. However, the third hard mask oxide film 408 and the third hard mask polysilicon film 409 shown in FIG. 4a are not deposited in FIG. 5a. An antireflection film 510 and a first photoresist film 512 are deposited over the second hard mask polysilicon film 507. A photolithography process is performed with a gate mask to determine a gate region. The second hard mask polysilicon film 507 and the antireflection film 510 exposed in cell, core and peripheral regions are sequentially etched.

Figure 5B:
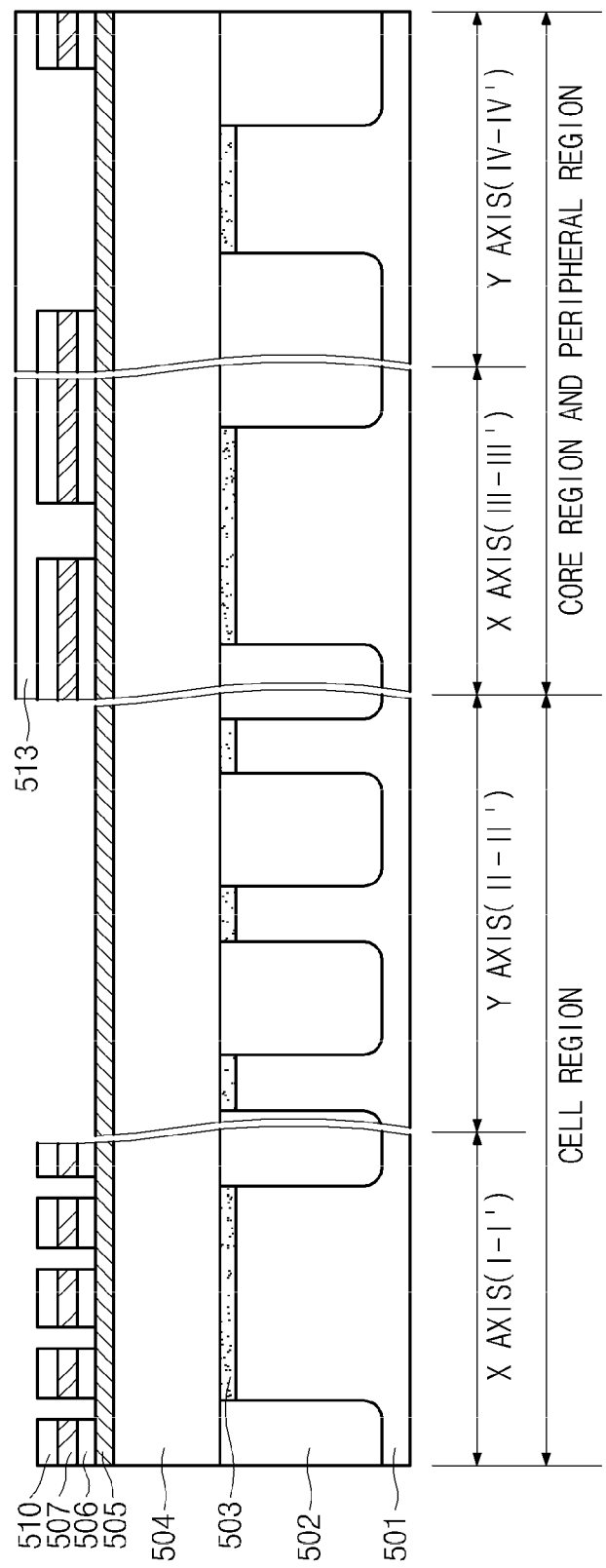

As shown in FIG. 5b, a second photoresist film 513 is deposited to expose the cell region with a cell open mask and to cover the core region and the peripheral region. The first hard mask polysilicon film 505 exposed in the cell region is etched.

Figure 5C:
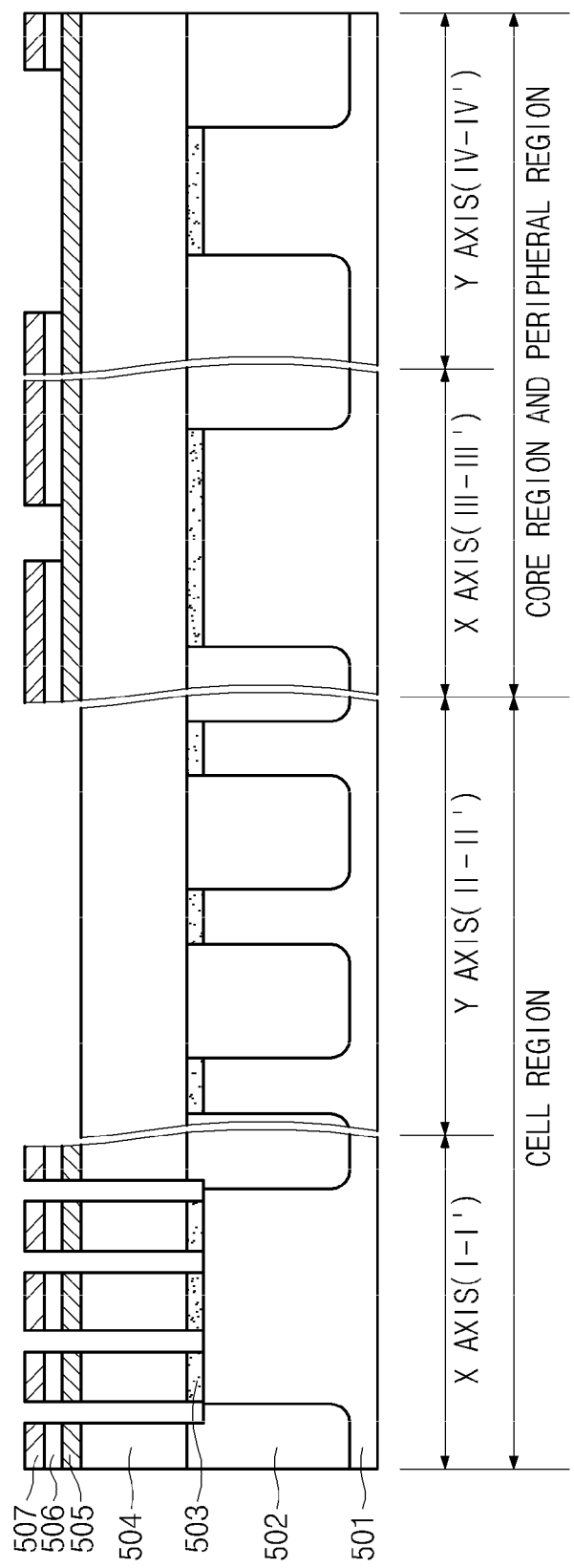

Then the second photoresist film 513 is removed. As shown in FIG. 5c, the etching selectivity is adjusted so that the first hard mask polysilicon film 505 exposed in the core and peripheral regions may not be removed. The buffer oxide film 503 and the first hard mask oxide film 504 exposed in the cell region are etched. Also, the antireflection film 510 disposed over a self-aligned mask of the cell is etched.

Figure 5D:
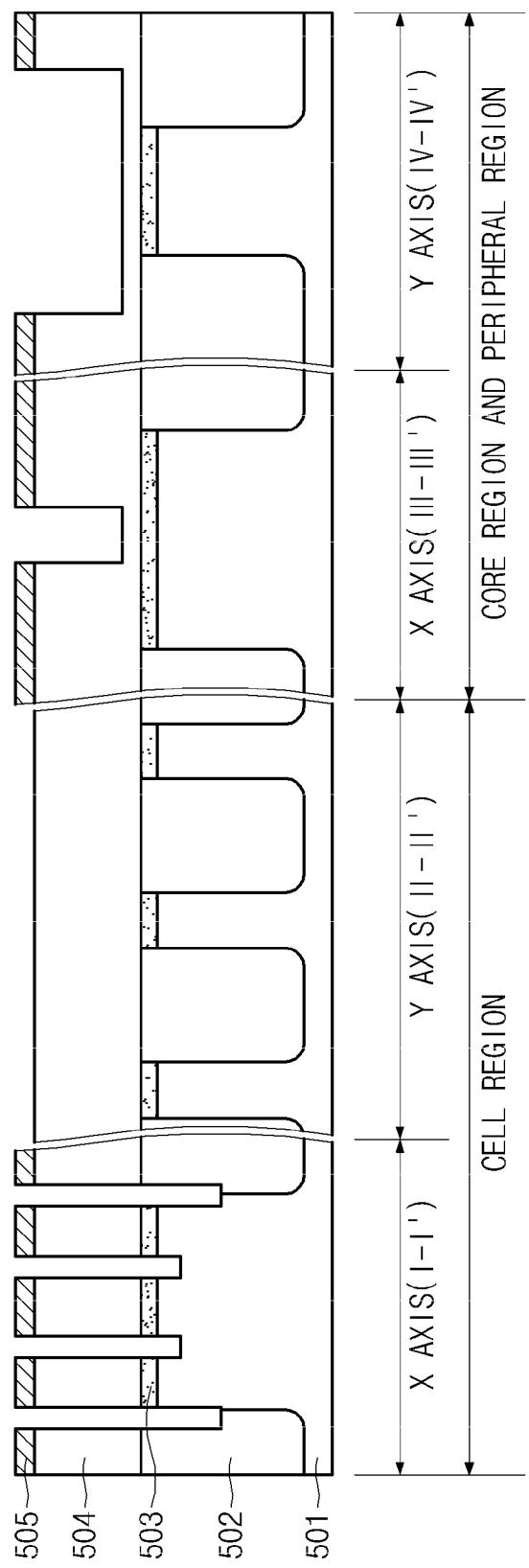

Referring to FIG. 5d, in order to form a fin region of the saddle-fin transistor, the semiconductor substrate 501 is etched, and the device isolation film 502 of the cell region is etched. This process is performed like the process of FIG. 4f. The processes after the semiconductor substrate 501 and the device isolation film 502 are removed are substantially similar to those shown in FIGS. 4g to 4l.

In another embodiment of the present invention, the third hard mask oxide film 408 and the third hard mask polysilicon film 409 are not deposited to obtain the saddle-fin transistor. The regions other than the cell region are covered with the second photoresist film 513. By regulating the etching selectivity, the antireflection film 510 and the second hard mask polysilicon film 507 are sequentially removed. However, while a plurality of layers is etched, the second photoresist film 513 may be etched. As a result, it is necessary to form the second photoresist film 513 having a sufficient thickness so that the first hard mask polysilicon film 505 may not be exposed in the core and peripheral regions.

As described above, according to an embodiment of the present invention, a semiconductor apparatus may include a three-dimensional saddle-fin transistor having a fin region disposed in a lower region of a gate electrode is fabricated by using two masks comprising an active mask for forming source/drain regions and a gate mask for forming a fin region and a gate region.

A semiconductor memory apparatus including a saddle-fin transistor formed by the above-described process may include a fin region having a depth broader than a width in a semiconductor substrate, a gate insulating film formed between the fin region and the semiconductor substrate, a gate pattern surrounded with a hard mask oxide film and a nitride film that protects a gate electrode consisting of an electrode and an upper electrode, and source/drain regions where impurities are ion-implanted into both sides of the gate pattern. Specifically, a gate lower electrode surrounds sidewalls of a gate upper electrode of the saddle-fin transistor.

In the saddle-fin transistor according to an embodiment of the present invention, the upper portion of the gate pattern is covered with the gate hard mask nitride film 420 in order to protect the gate upper electrode and the gate lower electrode, but the lower portion of the gate pattern is covered with the hard mask oxide film 404. Generally, a nitride film has a dielectric constant higher than that of an oxide film by 1.8 times. AS a result, not a nitride film but an oxide film is formed between an active region and the gate pattern to inhibit generation of parasite capacitance between the active region and the gate pattern.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method of fabricating a transistor, comprising:
   forming a buffer oxide film and a hard mask oxide film over a semiconductor substrate;
   etching the buffer oxide film, the hard mask oxide film and the semiconductor substrate corresponding to a mask pattern to form a trench corresponding to a gate electrode and a fin region;
   oxidizing the exposed semiconductor substrate in the trench to form a gate oxide film;
   depositing a gate lower electrode in the trench; and
   depositing a gate upper electrode over the gate lower electrode to fill the trench.

2. The method according to claim 1, wherein the forming a hard mask oxide film comprises forming a device isolation film over the semiconductor substrate using a Shallow Trench Isolation (STI) process.

3. The method according to claim 1, wherein the forming a trench comprises:
   forming a self-aligned mask through a photolithography process by using the mask pattern; and
   etching the entire surface of the resulting structure by using the self-aligned mask.

4. The method according to claim 3, wherein the forming a self aligned mask comprises:
   forming a hard mask polysilicon film over the hard mask oxide film;
   depositing a hard mask oxide film and a hard mask polysilicon film over the hard mask polysilicon film;
   depositing an antireflection film over the hard mask polysilicon film;
   depositing an upper hard mask polysilicon film over the anti-reflection film;
   etching the upper hard mask polysilicon film exposed by the mask pattern through the photolithography process;
   etching the anti-reflection film exposed by the etching process of the upper hard mask polysilicon film; and
   etching the exposed portion of the hard mask polysilicon film disposed at the bottom of the anti-reflection film.

5. The method according to claim 4, wherein the forming a trench comprises:
   repeatedly blanket-etching from the mask pattern, which is the top layer of the self-aligned mask, along with the self-aligned mask and the exposed layer between the self-aligned masks by different etching ratios until the semiconductor substrate is etched so as to form the fin region.

6. The method according to claim 1, further comprising:
   forming a gate pattern having a gate electrode that comprises the gate upper electrode and the gate lower electrode; and
   ion-implanting impurities into both sides of the gate pattern to form source/drain regions.

7. The method according to claim 6, wherein the forming a gate pattern comprises:
   etching the gate upper electrode and the gate lower electrode;
   wet-etching a space obtained from the etching process to remove a portion of the hard mask oxide film;
   depositing a nitride film in the space obtained from the etching process and the wet-etching process; and
   etching the hard mask oxide film with the nitride film as a mask to expose the buffer oxide film.

8. The method according to claim 7, wherein the forming a gate structure further comprises:
   performing a chemical mechanical polishing (CMP) process to expose the hard mask oxide film after filling the trench with the lower electrode, the upper electrode and the nitride film; and
   etching the exposed top portion of the upper electrode and the lower electrode before forming a gate hard mask nitride film to wet-etch a portion of the top portion of the hard mask oxide film.

9. The method according to claim 6, wherein the source/drain regions are formed with an active mask which is orthogonal with the gate pattern.

10. The method according to claim 6, wherein the mask pattern comprises patterns having various critical dimensions corresponding to the gate patterns.

11. The method according to claim 1, wherein etching the buffer oxide film, the hard mask oxide film and the semiconductor substrate comprising:
   selectively etching by an open mask from a first pattern region of a saddle-fin transistor and a second pattern region of all transistors except the saddle-fin transistor to form the trench.

12. The method according to claim 11, wherein the filling the trench comprises filling a nitride film in an unfilled space when the trench is not completely filled due to the broad gate region of the transistor.

13. The method according to claim 11, wherein one of the first and the second pattern regions are exposed by the open mask.

* * * * *